(12) United States Patent
Son et al.

(10) Patent No.: US 12,490,590 B2
(45) Date of Patent: Dec. 2, 2025

(54) DISPLAY DEVICE WITH IMPROVED RELIABILITY

(71) Applicant: Samsung Display Co., Ltd., Yongin-Si (KR)

(72) Inventors: Se Wan Son, Yongin-si (KR); Moo Soon Ko, Seoul (KR); Jin Sung An, Seongnam-si (KR); Jin Seok Oh, Pyeongtaek-si (KR); Min Woo Woo, Seoul (KR); Seong Jun Lee, Seoul (KR); Wang Woo Lee, Osan-si (KR); Ji Seon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 371 days.

(21) Appl. No.: 18/102,085

(22) Filed: Jan. 27, 2023

(65) Prior Publication Data
US 2023/0172000 A1 Jun. 1, 2023

Related U.S. Application Data

(63) Continuation of application No. 17/106,230, filed on Nov. 30, 2020, now Pat. No. 11,594,588.

(30) Foreign Application Priority Data

Apr. 22, 2020 (KR) .................... 10-2020-0048684

(51) Int. Cl.
*H01L 29/08* (2006.01)
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ............ H10K 59/1213; H10K 59/131; H10K 59/1216
USPC ......................................... 257/40
See application file for complete search history.

(56) References Cited

U.S. PATENT DOCUMENTS

| | | |
|---|---|---|
| 9,257,563 B2 | 2/2016 | Ahn et al. |
| 10,672,849 B2 | 6/2020 | Lee |
| 10,680,117 B2 | 6/2020 | Ji |
| 11,011,650 B2 | 5/2021 | Im et al. |
| 11,107,844 B2 | 8/2021 | Je et al. |
| 2011/0042666 A1 | 2/2011 | Yang et al. |

(Continued)

FOREIGN PATENT DOCUMENTS

| | | |
|---|---|---|
| CN | 108122928 A | 6/2018 |
| JP | 2003-007718 A | 1/2003 |

(Continued)

*Primary Examiner* — Phuc T Dang
(74) *Attorney, Agent, or Firm* — Innovation Counsel LLP

(57) ABSTRACT

Provided is a display device. The display device comprises a first active layer disposed on a substrate and made of a first material, a second active layer disposed on the first active layer and made of a second material different from the first material, a first gate layer disposed on the second active layer, and an inorganic pattern disposed below the second active layer and overlapping a portion of the first gate layer. The second active layer includes a conductor portion disposed between a portion of the first gate layer and the inorganic pattern.

18 Claims, 16 Drawing Sheets

(56) References Cited

U.S. PATENT DOCUMENTS

| | | | |
|---|---|---|---|
| 2011/0079786 A1* | 4/2011 | Kwon | H10K 59/1213 |
| | | | 257/E29.345 |
| 2015/0014641 A1* | 1/2015 | Jung | H01L 27/1251 |
| | | | 257/40 |
| 2018/0145125 A1 | 5/2018 | Lee et al. | |
| 2018/0151654 A1 | 5/2018 | Lee | |
| 2019/0006390 A1 | 1/2019 | Park | |
| 2019/0157630 A1 | 5/2019 | Kwon et al. | |
| 2019/0198534 A1 | 6/2019 | Je et al. | |
| 2020/0091255 A1 | 3/2020 | Wang et al. | |
| 2020/0135772 A1* | 4/2020 | Lee | G11C 19/28 |

FOREIGN PATENT DOCUMENTS

| | | |
|---|---|---|
| JP | 3566516 B2 | 9/2004 |
| JP | 2007-220817 A | 8/2007 |
| KR | 10-2019-0052925 A | 5/2019 |
| KR | 10-2019-0061823 A | 6/2019 |
| KR | 10-2019-0062695 A | 6/2019 |
| KR | 10-2019-0076220 A | 7/2019 |

* cited by examiner

DISPLAY DEVICE WITH IMPROVED RELIABILITY

CROSS-REFERENCE TO RELATED APPLICATION

This application is a continuation application of U.S. patent application Ser. No. 17/106,230 filed on Nov. 30, 2020, now issued as U.S. Pat. No. 11,594,588, U.S. patent application Ser. No. 17/106,230 claims priority under 35 USC § 119 to Korean Patent Application No. 10-2020-0048684 filed in the Korean Intellectual Property Office on Apr. 22, 2020, the entire contents of which are incorporated herein by reference.

BACKGROUND

1. Technical Field

The present disclosure relates to a display device, and more particularly to a display device capable of making an active layer and improving conductivity of the same.

2. Description of the Related Art

Recently, the demand for display devices for displaying images has increased and diversified. For example, display devices have been applied to various electronic devices such as smartphones, digital cameras, laptop computers, navigation devices, and smart televisions. The display device may be a flat panel display device such as a liquid crystal display device a field emission display device and an organic light emitting display device. Among the flat panel display devices, in the organic light emitting display device, since each of pixels of a display panel includes a light emitting element capable of emitting light by itself, an image can be displayed without a backlight unit which provides light to the display panel.

Each of the plurality of pixels of the display panel may include a plurality of thin film transistors. Thin film transistors may be classified according to materials constituting the active layer. For example, the thin film transistor may be implemented as a low temperature polycrystalline silicon thin film transistor including an active layer made of low temperature polycrystalline silicon (LTPS), or a metal oxide thin film transistor including an oxide-based active layer. The active area and the conductor region of the metal oxide thin film transistor may be formed by heat-treating the metal oxide. In this case, in a process of designing the metal oxide thin film transistor, the degree of freedom to design a pixel circuit may be reduced, and a variation in conductivity may occur, which may adversely affect the resolution of the display device. Thus, there is need to develop a novel display device to improve conductivity of the metal oxide thin film transistor in order to improve the resolution of the display device.

SUMMARY

Aspects of the present disclosure provide a display device capable of making an active layer, which overlaps an inorganic pattern, conductive even when a gate electrode is disposed on an oxide-based active layer in a heat treatment process by disposing the inorganic pattern having high hydrogen content below the oxide-based active layer.

Aspects of the present disclosure also provide a display device capable of improving conductivity of an active layer, which overlaps an inorganic pattern, in a heat treatment process by disposing the inorganic pattern having high hydrogen content below an oxide-based active layer.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device comprises a first active layer disposed on a substrate, the first active layer made of a first material, a second active layer disposed on the first active layer, the second active layer made of a second material different from the first material, a first gate layer disposed on the first active layer, and an inorganic pattern disposed below the second active layer and overlapping a portion of the first gate layer. The second active layer includes a conductor portion disposed on a portion of the first gate layer.

The display device may further comprise a first gate insulating layer disposed directly on the first active layer and configured to insulate the second active layer from the first gate layer. A hydrogen content of the inorganic pattern may be higher than a hydrogen content of the first gate insulating layer.

The display device may further comprise a second gate layer disposed on the first active layer, a first interlayer insulating layer disposed on the second gate layer, a second interlayer insulating layer disposed on the second gate layer and in direct contact with the second gate layer, and a third gate layer disposed on the first interlayer insulating layer. The inorganic pattern may be disposed between the second interlayer insulating layer and the conductor portion of the second active layer.

A hydrogen content of the inorganic pattern may be higher than a hydrogen content of the second interlayer insulating layer.

A conductivity of the conductor portion in the second active layer may be higher than a conductivity of a portion other than the conductor portion in the second active layer.

According to an embodiment of the present disclosure, a display device comprises a display panel for driving a plurality of pixels having light emitting elements. Each of the plurality of pixels comprises a driving transistor including an active area disposed in a first active layer made of a first material and configured to control a driving current flowing through the light emitting element, a first transistor including an active area disposed in a second active layer made of a second material different from the first material, the first transistor selectively connecting between a first node which is a drain electrode of the driving transistor and a second node which is a gate electrode of the driving transistor, a first scan line disposed in a first gate layer on the second active layer and connected to a gate electrode of the first transistor, and an inorganic pattern overlapping an intersection area of the second active layer and the first scan line.

The inorganic pattern may be in direct contact with a lower portion of the second active layer, and the second active layer may include a conductor portion disposed between the first scan line and the inorganic pattern.

The gate electrode of the driving transistor and a source electrode of the first transistor may be electrically connected through the conductor portion of the second active layer.

Each of the plurality of pixels may further comprise a second transistor configured to supply a data voltage to a third node which is a source electrode of the driving transistor based on a voltage of a second scan line disposed in a second gate layer on the first active layer, and a first capacitor connected between the second scan line and the second node. A first electrode of the first capacitor may be disposed in the second gate layer, and a second electrode of the first capacitor may be disposed in the second active layer.

The gate electrode of the driving transistor and the second electrode of the first capacitor may be electrically connected through a conductor portion of the second active layer.

Each of the plurality of pixels may further comprise a second capacitor connected between the second node and a driving voltage line. A first electrode of the second capacitor and the second electrode of the first capacitor may be electrically connected through the conductor portion of the second active layer.

Each of the plurality of pixels may further comprise a first connection electrode disposed in a source-drain layer on the first gate layer. The first connection electrode may be connected to the gate electrode of the driving transistor disposed in the second gate layer through a first contact hole, and may be connected to the second active layer through a second contact hole.

Each of the plurality of pixels may further comprise a third transistor configured to selectively supply an initialization voltage to the second node, a fourth transistor configured to selectively supply a driving voltage to the third node, a fifth transistor configured to selectively connect the first node to a fourth node which is connected to an anode electrode of the light emitting element, and a sixth transistor configured to selectively supply the initialization voltage to the fourth node.

A gate electrode of the third transistor may be connected to a third scan line disposed in the first gate layer, and a gate electrode of each of the fourth transistor and the fifth transistor may be connected to an emission control line disposed on the second gate layer, and a gate electrode of the sixth transistor may be connected to the second scan line.

According to an embodiment of the present disclosure, a display device comprises a display panel for driving a plurality of pixels having light emitting elements. Each of the plurality of pixels comprises a driving transistor including an active area disposed in a first active layer made of a first material and controlling a driving current flowing through the light emitting element, a first transistor including an active area disposed in a second active layer made of a second material different from the first material, the first transistor connecting a first node which is a drain electrode of the driving transistor to a second node which is a gate electrode of the driving transistor based on a voltage of a first scan line disposed in a first gate layer on the second active layer, a first capacitor including a first electrode corresponding to a portion of a second scan line disposed in a second gate layer on the first active layer, and a second electrode connected to the second node and disposed in the second active layer, and an inorganic pattern disposed below the second electrode of the first capacitor. A conductivity of the second electrode of the first capacitor is higher than a conductivity of the second active layer which does not overlap the inorganic pattern.

A conductivity of the second electrode of the first capacitor may be higher than a conductivity of a source electrode of the first transistor.

Each of the plurality of pixels may further comprise a second connection electrode disposed in a source-drain layer on the first gate layer. The first connection electrode may be connected to the gate electrode of the driving transistor disposed in the second gate layer through a third contact hole, and may be connected to the second electrode of the first capacitor disposed in the second active layer through a fourth contact hole.

Each of the plurality of pixels may further comprise a second transistor configured to supply a data voltage to a third node which is a source electrode of the driving transistor based on a voltage of the second scan line.

Each of the plurality of pixels may further comprise a third transistor configured to selectively supply an initialization voltage to the second node. A conductivity of the second electrode of the first capacitor may be higher than a conductivity of a source electrode of the third transistor.

Each of the plurality of pixels may further comprise a fourth transistor configured to selectively supply a driving voltage to the third node, a fifth transistor configured to selectively connect the first node to a fourth node which is an connected to anode electrode of the light emitting element, and a sixth transistor configured to selectively supply the initialization voltage to the fourth node.

According to the display device according to example embodiments, each of a plurality of pixels of the display device may include a low temperature polycrystalline silicon thin film transistor and a metal oxide thin film transistor. The oxide-based active layer of the metal oxide thin film transistor may be made conductive by receiving hydrogen from an inorganic layer disposed on the active layer through a heat treatment process. When each of the plurality of pixels has a gate electrode disposed between the oxide-based active layer and the inorganic layer, an inorganic pattern having a high hydrogen content may be disposed below the oxide-based active layer overlapping the gate electrode. In the display device, even if a gate electrode is disposed on an oxide-based active layer in a heat treatment process, the active layer may be made conductive using an inorganic pattern having high hydrogen content. Accordingly, the display device can use the active layer disposed below the gate electrode as a wiring, and thus the degree of freedom in design can be increased through various contact structures and bridge structures. As the degree of freedom in design increases, the display device can increase space utilization and improve the resolution of the display device.

According to the display device according to the embodiments, the display device can improve the conductivity of the active layer overlapping the inorganic pattern in a heat treatment process by disposing the inorganic pattern having high hydrogen content below the oxide-based active layer. Thus, the display device can eliminate luminance non-uniformity (mura) due to a variation in conductivity of a plurality of pixels, and improve the reliability of the display device.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
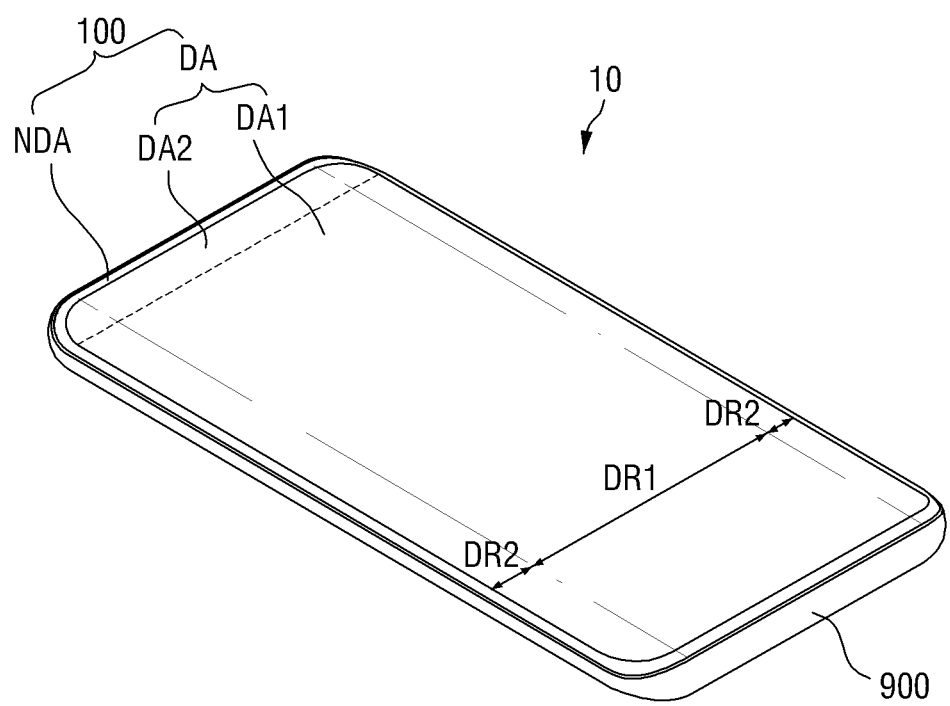
FIG. 1 is a perspective view illustrating a display device according to an example embodiment.

In the following description, for the purposes of explanation, numerous specific details are set forth in order to provide a thorough understanding of various example embodiments or implementations of the invention. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
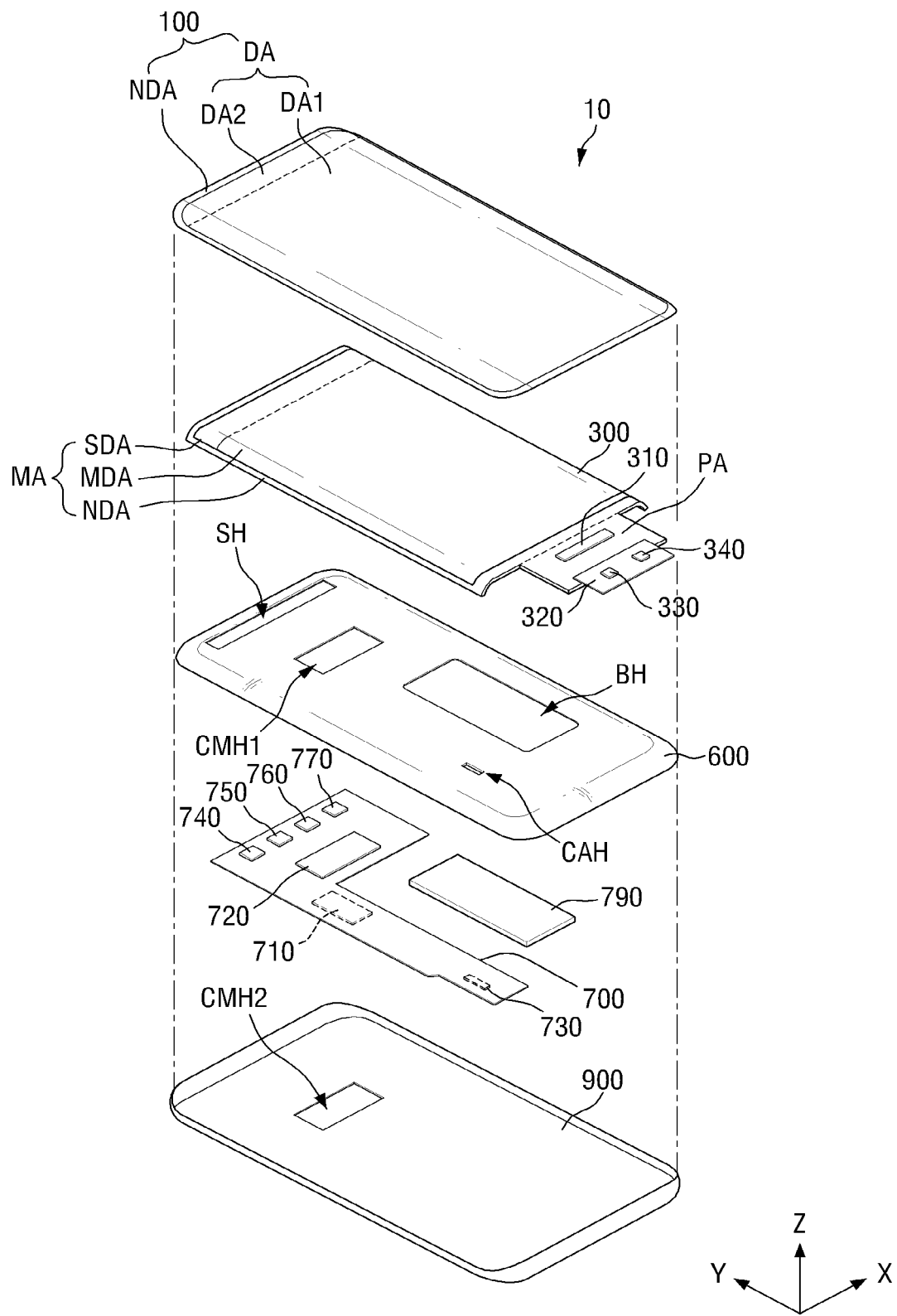
FIG. 2 is an exploded perspective view illustrating a display device according to an example embodiment.

FIG. 1 is a perspective view illustrating a display device according to an example embodiment. FIG. 2 is an exploded perspective view illustrating a display device according to an example embodiment.

Referring to FIGS. 1 and 2, a display device 10 according to an example embodiment includes a cover window 100, a display panel 300, a bracket 600, a main circuit board 700, and a lower cover 900.

The terms "above," "top" and "upper surface" as used herein refer to an upward direction (i.e., a Z-axis direction) with respect to the display device 10. The terms "below," "bottom" and "lower surface" as used herein refer to a downward direction (i.e., a direction opposite to the Z-axis direction) with respect to the display device 10. Further, "left", "right", "upper" and "lower" indicate directions when the display device 10 is viewed from above. For example, "left" refers to a direction opposite to an X-axis direction, "right" refers to the X-axis direction, "upper" refers to a Y-axis direction, and "lower" refers to a direction opposite to the Y-axis direction.

The display device 10 is a device for displaying a moving image or a still image. The display device may be used as a display screen of various products such as televisions, laptop computers, monitors, billboards and the Internet of Things (JOT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 10 may have a rectangular shape in a plan view. For example, the display device 10 may have a rectangular shape, in a plan view, having short sides in a first direction (X-axis direction) and long sides in a second direction (Y-axis direction), as shown in FIGS. 1 and 2. The corner where the short side in the first direction (X-axis direction) and the long side in the second direction (Y-axis direction) meet may be rounded to have a predetermined curvature or may be right-angled without any curvature. The planar shape of the display device 10 is not limited to a rectangular shape, and may be formed in other polygonal shapes, a circular shape, or elliptical shape.

The display device 10 may include a first region DR1 formed to be flat and a second region DR2 extending from the left and right sides of the first region DR1. The second region DR2 may be formed to be flat or curved. When the second region DR2 is formed to be flat, an angle formed between the first region DR1 and the second region DR2 may be an obtuse angle. When the second region DR2 is formed as a curved surface, it may have a constant curvature or a varying curvature.

Although FIG. 1 illustrates that the second region DR2 extends from each of the left and right sides of the first region DR1, the present disclosure is not limited thereto. That is, the second region DR2 may extend only from one side of the left and right sides of the first region DR1. Alternatively, the second region DR2 may extend from at least one of the upper and lower sides as well as the left and right sides of the first region DR1. Hereinafter, a case where the second region DR2 is disposed on the left and right edges of the display device 10 will be described mainly.

The cover window 100 may be disposed on the display panel 300 to cover a top surface of the display panel 300. The cover window 100 may protect the top surface of the display panel 300.

The cover window 100 may be disposed on the first region DR1 and the second region DR2. The cover window 100 may include a first transmission portion DA1 and a second transmission portion DA2 corresponding to the display panel 300, and a light blocking portion NDA corresponding to a region other than the display panel 300. The second transmission portion DA2 may be disposed on one side of the first transmission portion DA1, for example, above the first transmission portion DA1, as illustrated in FIGS. 1 and 2. The first transmission portion DA1 and the second transmission portion DA2 may be disposed in the first region DR1 and the second region DR2. The light blocking portion NDA may be formed opaquely. Alternatively, the light blocking portion NDA may be formed as a decorative layer having a pattern that can be displayed to a user when an image is not displayed.

The display panel 300 may be disposed below the cover window 100. The display panel 300 may be disposed in the first region DR1 and the second region DR2. The image displayed by the display panel 300 may be viewed in the first region DR1 and the second region DR2 through the cover window 100. Accordingly, the image displayed by the display panel 300 may be viewed through the cover window 100 at the top and left and right edges of the display device 10.

The display panel 300 may be a light emitting display panel including a light emitting element. For example, the display panel 300 may be an organic light emitting display panel using an organic light emitting diode including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting element including an inorganic semiconductor. Hereinafter, a case where the display panel 300 is an organic light emitting display panel will be mainly described.

The display panel 300 may include a main area MA and a protruding area PA protruding from one side of the main area MA.

The main area MA may include a general area MDA, a sensor area SDA, and a non-display area NDA.

The general area MDA may be disposed to overlap the first transmission portion DA1 of the cover window 100. The sensor area SDA may be disposed to overlap the second transmission part DA2 of the cover window 100. The sensor area SDA may be disposed on one side of the general area MDA, for example, above the general area MDA, as illustrated in FIG. 2, but the present disclosure is not limited thereto. As another example, the sensor area SDA may be disposed to be surrounded by the general area MDA, and may be disposed adjacent to a corner of the display panel 300. Further, although FIG. 2 illustrates that the display panel 300 includes one sensor area SDA, the present disclosure is not limited thereto. For example, the display panel 300 may include a plurality of sensor areas SDA.

Each of the general area MDA and the sensor area SDA may include a plurality of pixels, scan lines and data lines connected to the plurality of pixels, and a power supply line.

The non-display area NDA may be defined as an edge area of the display panel 300. The non-display area NDA may include a scan driver for applying scan signals to scan lines, and link lines connecting the data lines to the display driver 310.

The protruding area PA may protrude from one end of the main area MA. In FIG. 2, the protruding area PA may protrude from the lower end of the general area MDA. For example, the length of the protruding area PA in the first direction (X-axis direction) may be smaller than the length of the main area MA in the first direction (X-axis direction).

The protruding area PA may include a bending area (not shown) and a pad area (not shown). In this case, the pad area may be disposed on one end of the bending area, and the main area MA may be disposed on the other end of the bending area. For example, the pad area may be disposed below the bending area, and the main area MA may be disposed above the bending area.

The display panel 300 may be formed flexibly such that it can be bent, folded, or rolled. Therefore, the display panel 300 may be bent in the thickness direction (Z-axis direction) in the bending area.

The display panel 300 may include a display driver 310, a circuit board 320, a power supply unit 330, and a touch driver 340.

The display driver 310 may output signals and voltages for driving the display panel 300. For example, the display driver 310 may supply a data voltage to the data line. Further, the display driver 310 may supply a power voltage to the power line, and may supply a scan control signal to the scan driver.

The circuit board 320 may be attached on pads using an anisotropic conductive film (ACF). Further, lead lines of the circuit board 320 may be electrically connected to pads of the display panel 300. For example, the circuit board 320 may be a flexible film, such as a flexible printed circuit board, a printed circuit board (PCB), or a chip on film (COF).

The power supply unit 330 may be disposed on the circuit board 320 to supply a driving voltage to the display driver 310 and the display panel 300. Specifically, the power supply unit 330 may generate a driving voltage and supply it to the driving voltage line, and the power supply unit 330 may generate a low potential voltage and supply it to the cathode electrode of a light emitting element of each of the sub-pixels. For example, the driving voltage may be a high potential voltage for driving a light emitting element, for example, an organic light emitting diode, and the low potential voltage may be a low potential voltage for driving an organic light emitting diode.

The touch driver 340 may be disposed on the circuit board 320 to measure the capacitance of the touch electrodes. For example, the touch driver 340 may determine whether the user has touched, the position of the user's touch and the like, based on the change in capacitance of the touch electrodes. Here, the user's touch means that an object such as a user's finger or pen is in direct contact with one surface of the display device 10 disposed on a touch sensing layer. Further, the touch driver 340 may determine the user's touch position by distinguishing a portion of the plurality of touch electrodes where the user's touch occurs from a portion where no user's touch occurs.

The bracket 600 may be disposed below the display panel 300. The bracket 600 may be made of plastic, metal, or a combination thereof. For example, the bracket 600 may include a first camera hole CMH1 into which a first camera sensor 720 is inserted, a battery hole BH in which a battery 790 is disposed, a cable hole CAH through which a cable connected to the display driver 310 or the circuit board 320 passes, and a sensor hole SH in which sensor devices 740, 750, 760 and 770 are disposed. As another example, the bracket 600 may be formed so as not to overlap the sensor area SDA of the display panel 300 without including the sensor hole SH.

The main circuit board 700 and the battery 790 may be disposed below the bracket 600. The main circuit board 700 may be a printed circuit board or a flexible printed circuit board.

The main circuit board 700 may include a main processor 710, a first camera sensor 720, a main connector 730, and sensor devices 740, 750, 760 and 770. The first camera sensor 720 may be disposed on both the upper and lower surfaces of the main circuit board 700, the main processor 710 may be disposed on the upper surface of the main circuit board 700, and the main connector 730 may be disposed on the bottom surface of the main circuit board 700. The sensor devices 740, 750, 760 and 770 may be disposed on the upper surface of the main circuit board 700.

The main processor 710 may control all functions of the display device 10. For example, the main processor 710 may supply digital video data to the display driver 310 such that the display panel 300 displays an image. The main processor 710 may receive touch data from the touch driver 340 and determine the user's touch coordinates, and then execute an application indicated by an icon displayed on the user's touch coordinates.

The main processor 710 may control the display device 10 according to sensor signals inputted from the sensor devices 740, 750, 760 and 770. For example, the main processor 710 may determine whether an object is located close to the top surface of the display device 10 according to a proximity sensor signal inputted from a proximity sensor 740. The main processor 710 may not execute an application indicated by an icon displayed in touch coordinates even when a touch is executed by a user when an object is located close to the top surface of the display device 10 in a call mode.

The main processor 710 may determine the brightness of the top surface of the display device 10 according to an illuminance sensor signal inputted from an illuminance sensor 750. The main processor 710 may adjust the luminance of an image displayed by the display panel 300 according to the brightness of the top surface of the display device 10.

The main processor 710 may determine whether the iris image of the user is the same as the iris image previously stored in the memory according to an iris sensor signal inputted from an iris sensor 760. The main processor 710 may unlock the display device 10 and display a home screen on the display panel 300 when the iris image of the user is the same as the iris image previously stored in the memory.

The first camera sensor 720 may process an image frame of a still image or video obtained by the image sensor and output it to the main processor 710. For example, the first camera sensor 720 may be a CMOS image sensor or a CCD sensor, but is not limited thereto. The first camera sensor 720 may be exposed to the bottom surface of the lower cover 900 by a second camera hole CMH2, and capture an image of an object located back of the display device 10.

A cable passing through the cable hole CAH of the bracket 600 may be connected to the main connector 730. Thus, the main circuit board 700 may be electrically connected to the display driver 310 or the circuit board 320.

The sensor devices may include the proximity sensor 740, the illuminance sensor 750, the iris sensor 760, and a second camera sensor 770.

The proximity sensor 740 may detect whether an object is close to the top surface of the display device 10. For example, the proximity sensor 740 may include a light source that outputs light and a light receiver that receives light reflected by an object. The proximity sensor 740 may determine whether an object located close to the front surface of the display device 10 presents according to the amount of light reflected by the object. Since the proximity sensor 740 is disposed to overlap the sensor hole SH, the sensor area SDA of the display panel 300 and the second transmission portion DA2 of the cover window 100 in the thickness direction (Z-axis direction) of the display panel 300, the proximity sensor 740 may generate a proximity sensor signal and output it to the main processor 710 according to the presence of an object located close to the top surface of the display device 10.

The illuminance sensor 750 may detect the brightness of the top surface of the display device. The illuminance sensor 750 may include a resistor whose resistance value changes according to the brightness of the incident light. The illuminance sensor 750 may determine the brightness of the top surface of the display device according to the resistance value of the resistor. Since the illuminance sensor 750 is disposed to overlap the sensor hole SH, the sensor area SDA of the display panel 300 and the second transmission portion DA2 of the cover window 100 in the thickness direction (Z-axis direction) of the display panel 300, the illuminance sensor 750 may generate an illuminance sensor signal and output it to the main processor 710 according to the brightness of the upper surface of the display device.

The iris sensor 760 may detect whether the image of the user's iris is the same as the iris image previously stored in the memory. The iris sensor 760 may generate and output an iris sensor signal to the main processor 710 according to the comparison between the user's iris image and the iris image previously stored in the memory.

The second camera sensor 770 may process an image frame of a still image or video obtained by the image sensor and output it to the main processor 710. For example, the second camera sensor 770 may be a CMOS image sensor or a CCD sensor, but is not limited thereto. The number of pixels of the second camera sensor 770 may be smaller than the number of pixels of the first camera sensor 720, and the size of the second camera sensor 770 may be smaller than the size of the first camera sensor 720. Since the second camera sensor 770 is disposed to overlap the sensor hole SH, the sensor area SDA of the display panel 300 and the second transmission portion DA2 of the cover window 100 in the thickness direction (Z-axis direction) of the display panel 300, the second camera sensor 770 may capture an image of an object located in front of the display device 10.

The battery 790 may be disposed so as not to overlap the main circuit board 700 in the third direction (Z-axis direction). The battery 790 may overlap the battery hole BH of the bracket 600.

The main circuit board 700 may further include a mobile communication module capable of transmitting and receiving radio signals with at least one of a base station, an external terminal, and a server in a mobile communication network. The wireless signal may include various types of data according to transmission and reception of a voice signal, a video call signal, or a text/multimedia message.

The lower cover 900 may be disposed below the main circuit board 700 and the battery 790. The lower cover 900 may be fixedly fastened to the bracket 600. The lower cover 900 may form an external appearance of the bottom surface of the display device 10. The lower cover 900 may be made of plastic, metal, or a combination thereof.

The lower cover 900 may include a second camera hole CMH2 through which the lower surface of the first camera sensor 720 is exposed. The position of the first camera sensor 720 and the positions of the first and second camera holes CMH1 and CMH2 corresponding to the first camera sensor 720 are not limited to the embodiment illustrated in FIG. 2.

Figure 3:
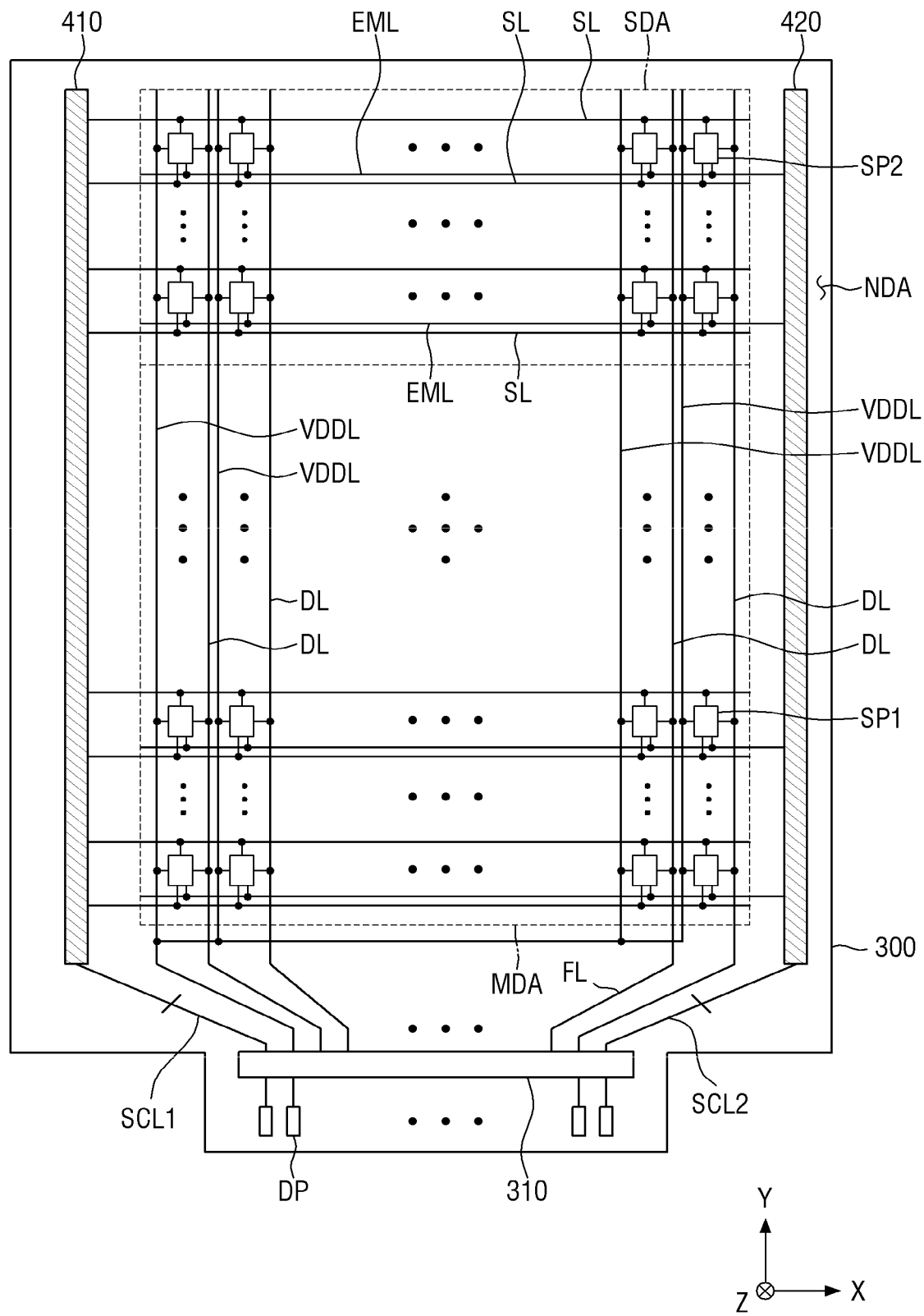
FIG. 3 is a plan view illustrating a display panel according to an example embodiment.
Figure 4:
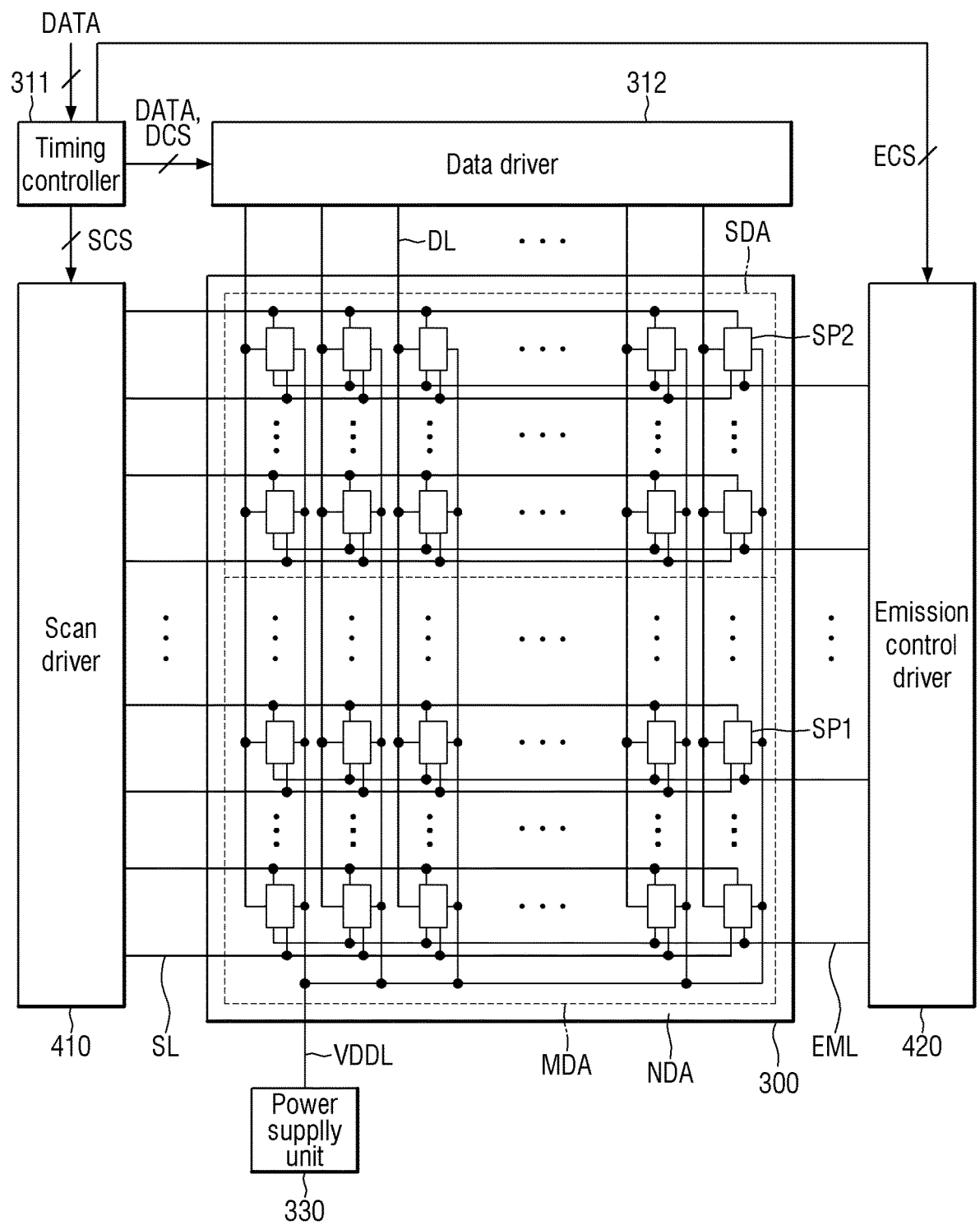
FIG. 4 is a block diagram illustrating a display panel and a display driving unit according to an example embodiment.

FIG. 3 is a plan view illustrating a display panel according to an example embodiment. FIG. 4 is a block diagram illustrating a display panel and a display driving unit according to an example embodiment.

Referring to FIGS. 3 and 4, the display panel 300 may include a general area MDA, a sensor area SDA, and a non-display area NDA.

The general area MDA may include a plurality of first sub-pixels SP1, driving voltage lines VDDL connected to the first sub-pixels SP1, scan lines SL, emission control lines EML, and data lines DL.

The first sub-pixels SP1 may be connected to at least one scan line SL, at least one data line DL, at least one emission control line EML, and at least one driving voltage line VDDL. In FIGS. 3 and 4, each of the first sub-pixels SP1 may be connected to two scan lines SL, one data line DL, one emission control line EML, and one driving voltage line VDDL, but the present disclosure is not necessarily limited thereto. For example, each of the first sub-pixels SP1 may be connected to three or more scan lines SL.

Each of the first sub-pixels SP1 may include a driving transistor, at least one switching transistor, a light emitting element, and a capacitor.

The first sub-pixels SP1 may receive a driving voltage VDD (not shown) through a driving voltage line VDDL. Here, the driving voltage VDD may be a high potential voltage for driving the light emitting element of the first sub-pixels SP1.

The scan lines SL and the emission control lines EML may extend in the first direction (X-axis direction) and may be spaced apart from each other in the second direction (Y-axis direction) intersecting the first direction (X-axis direction).

The data lines DL and the driving voltage lines VDDL may extend in the second direction (Y-axis direction) and may be spaced apart from each other in the first direction (X-axis direction).

The sensor area SDA may include a plurality of second sub-pixels SP2, driving voltage lines VDDL connected to the second sub-pixels SP1, scan lines SL, emission control lines EML, and data lines DL.

The second sub-pixels SP2 may be connected to at least one scan line SL, at least one data line DL, at least one emission control line EML, and at least one driving voltage line VDDL. In FIGS. 3 and 4, each of the second sub-pixels SP2 may be connected to two scan lines SL, one data line DL, one emission control line EML, and one driving voltage line VDDL, but the present disclosure is not necessarily limited thereto. For example, each of the second sub-pixels SP2 may be connected to three or more scan lines SL.

Each of the second sub-pixels SP2 may include a driving transistor, at least one switching transistor, a light emitting element, and a capacitor.

The second sub-pixels SP2 may receive a driving voltage VDD through a driving voltage line VDDL. Here, the driving voltage VDD may be a high potential voltage for driving the light emitting element of the second sub-pixels SP2.

Although not specifically illustrated in FIGS. 3 and 4, the number of first sub-pixels SP1 per unit area in the general area MDA may be greater than the number of second sub-pixels SP2 per unit area in the sensor area SDA. The general area MDA is an area for displaying an image, which is a main function of the display device 10, and the first sub-pixels SP1 may be densely arranged therein. The sensor area SDA may include a pixel area in which the second sub-pixels SP2 are disposed and a transmission area through which light is transmitted. Accordingly, as the area of the transmission area of the sensor area SDA increases, the number of second sub-pixels SP2 per unit area may be smaller than the number of first sub-pixels SP1 per unit area.

The non-display area NDA may be defined as the remaining area of the display panel 300 except for the general area MDA and the sensor area SDA. The non-display area NDA may include a scan driver 410 for applying scan signals to the scan lines SL, fan out lines FL connecting the data lines DL to the display driver 310, and pads DP connected to the circuit board 320. The display driver 310 and the pads DP may be disposed in the pad area of the display panel 300. The pads DP may be disposed closer to one end of the pad area than the display driver 310.

In FIG. 4, the display driver 310 may include a timing controller 311 and a data driver 312.

The timing controller 311 may receive digital video data DATA and timing signals from the circuit board 320. The timing controller 311 may generate a scan control signal (SCS) based on the timing signals to control the operation timing of the scan driver 410, generate an emission control signal (ECS) to control the operation timing of an emission control driver 420, and generate a data control signal (DCS) to control the operation timing of the data driver 312. The timing controller 311 may output the scan control signal SCS to the scan driver 410 through a first scan control line SCL1. The timing controller 311 may output the emission control signal ECS to the emission control driver 420 through a second scan control line SCL2. The timing controller 311 may output digital video data DATA and data control signals DCS to the data driver 312.

The data driver 312 may convert the digital video data DATA into analog data voltages and output them to the data lines DL through fan-out lines FL. The scan signals of the scan driver 410 may select sub-pixels SP to which the data voltage is supplied, and the selected sub-pixels SP may receive the data voltage through the data lines DL.

In FIG. 3, the scan driver 410 may be disposed outside one portion of the general area MDA and the sensor area SDA or disposed on one portion of the non-display area NDA. The emission control driver 420 may be disposed outside the other portion of the general area MDA and the sensor area SDA or disposed on the other portion of the non-display area NDA. As another example, both the scan driver 410 and the emission control driver 420 may be disposed outside one portion of the general area MDA and the sensor area SDA.

The scan driver 410 may include a plurality of thin film transistors for generating scan signals based on the scan control signal (SCS), and the emission control driver 420 may include a plurality of thin film transistors for generating emission signals based on the emission control signal (ECS). For example, the thin film transistors of the scan driver 410 and the thin film transistors of the emission control driver 420 may be formed on the same layer as the thin film transistors of the first and second sub-pixels SP1 and SP2, respectively.

Figure 5:
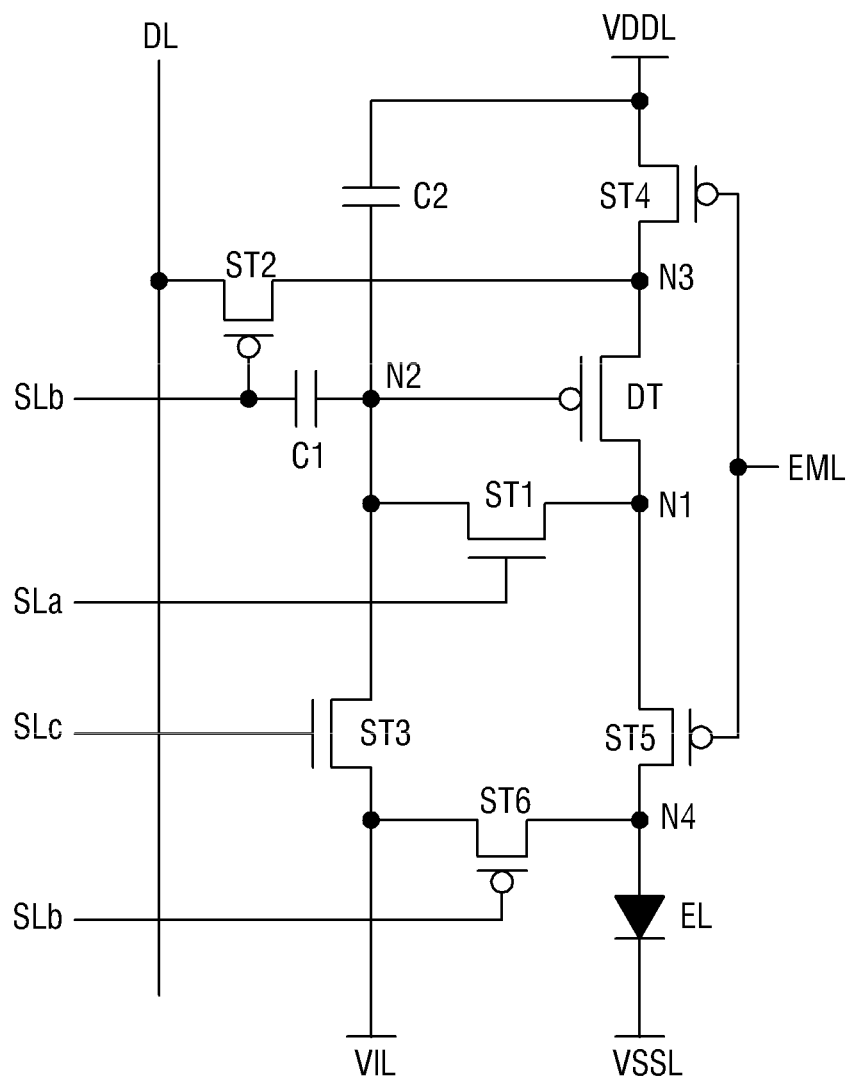
FIG. 5 is a circuit diagram illustrating a sub-pixel according to an example embodiment.
Figure 6:
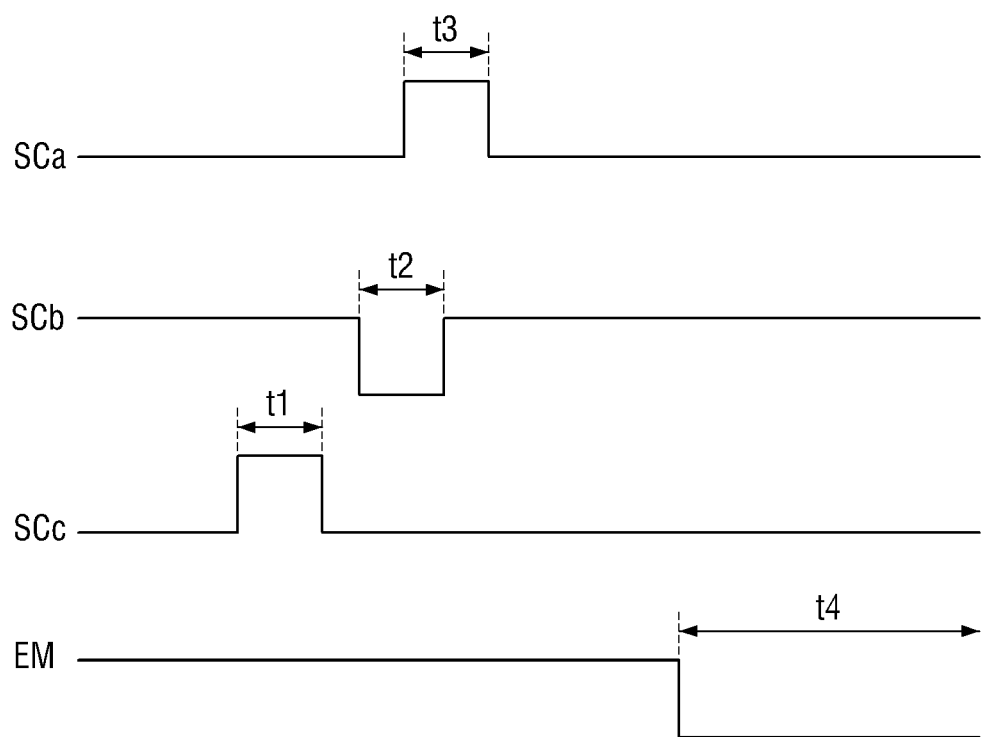
FIG. 6 is a waveform diagram of signals supplied to the sub-pixel shown in FIG. 5.

FIG. 5 is a circuit diagram illustrating a sub-pixel according to an example embodiment. FIG. 6 is a waveform diagram of signals supplied to the sub-pixel shown in FIG. 5. Here, the sub-pixel illustrated in FIG. 5 may correspond to the first sub-pixel SP1 or the second sub-pixel SP2 illustrated in FIGS. 3 and 4.

Referring to FIGS. 5 and 6, the display panel 300 may include a plurality of sub-pixels arranged along p rows (p is a natural number) and q columns (q is a natural number). Each of the plurality of sub-pixels may be connected to a first scan line SLa, a second scan line SLb, a third scan line SLc, an emission control line EML, a data line DL, a driving voltage line VDDL, and an initialization voltage line VIL.

The sub-pixel SP may include a driving transistor DT, a light emitting element EL, a plurality of switching elements, and first and second capacitors C1 and C2. The switching elements may include first to sixth transistors ST1, ST2, ST3, ST4, ST5 and ST6.

The driving transistor DT may include a gate electrode, a source electrode, and a drain electrode. The driving transistor DT may control a source-drain current Isd (hereinafter, referred to as "driving current") according to the data voltage applied to the gate electrode. The driving current Isd flowing through the channel of the driving transistor DT may be proportional to the square of a difference between the threshold voltage Vth and the voltage Vsg between the source electrode and the gate electrode of the driving transistor DT (Isd=k–(Vsg–Vth)$^2$). Here, k is a proportional coefficient determined by the structure and physical characteristics of the driving transistor DT, Vsg is a source-gate voltage of the driving transistor DT, and Vth is a threshold voltage of the driving transistor DT.

The light emitting element EL may emit light by receiving a driving current. The light emission amount or luminance of the light emitting element EL may be proportional to the magnitude of the driving current.

The light emitting element EL may be an anode electrode, a cathode electrode, and an organic light emitting diode including an organic light emitting layer disposed between the anode electrode and the cathode electrode. Alternatively, the light emitting element EL may be an anode electrode, a cathode electrode, and an inorganic light emitting element including an inorganic semiconductor disposed between the anode electrode and the cathode electrode. Alternatively, the light emitting element EL may be an anode electrode, a cathode electrode, and a quantum dot light emitting element including a quantum dot light emitting layer disposed between the anode electrode and the cathode electrode. Alternatively, the light emitting element EL may be a micro light emitting diode.

The anode electrode of the light emitting element EL may be connected to a fourth node N4. The anode electrode of the light emitting element EL may be connected to the drain electrode of a fifth transistor ST5 and the drain electrode of a sixth transistor T6 through the fourth node N4. The cathode electrode of the light emitting element EL may be connected to a low potential line VSSL. A parasitic capacitance may be formed between the anode electrode and the cathode electrode of the light emitting element EL.

The first transistor ST1 may be turned on by a first scan signal SCa of the first scan line SLa to connect the first node N1 which is the drain node of the driving transistor DT to the second node N2 which is the gate electrode of the driving transistor DT. The gate electrode of the first transistor ST1 may be connected to the first scan line SLa, the drain electrode of the first transistor ST1 may be connected to the first node N1, and the source electrode of the first transistor ST1 may be connected to the second node N2. The drain electrode of the first transistor ST1 may be connected to the drain electrode of the driving transistor DT and the source electrode of the fifth transistor ST5 through the first node N1. The source electrode of the first transistor ST1 may be connected to the gate electrode of the driving transistor DT, the source electrode of the third transistor ST3, the second electrode of the first capacitor C1, and the first electrode of the second capacitor C2 through the second node N2.

The second transistor ST2 may be turned on by a second scan signal SCb of the second scan line SLb to turn on the data line DL and a third node N3 which is the source electrode of the driving transistor DT. The second transistor ST2 may be turned on based on the second scan signal SCb to supply the data voltage to the third node N3. The gate electrode of the second transistor ST2 may be connected to the second scan line SLb, the source electrode of the second transistor ST2 may be connected to the data line DL, and the drain electrode of the second transistor ST2 may be connected to the third node N3. The drain electrode of the second transistor ST2 may be connected to the source electrode of the driving transistor DT and the drain electrode of the fourth transistor ST4 through the third node N3.

The third transistor ST3 may be turned on by a third scan signal SCc of the third scan line SLc to connect an initialization voltage line VIL to the second node N2 which is the gate electrode of the driving transistor DT. The third transistor ST3 may be turned on based on the third scan signal SCc to discharge the gate electrode of the driving transistor DT to an initialization voltage. The gate electrode of the third transistor ST3 may be connected to the third scan line SLc, the drain electrode of the third transistor ST3 may be connected to the initialization voltage line VIL, and the source electrode of the third transistor ST3 may be connected to the second node N2. The source electrode of the third transistor ST3 may be connected to the gate electrode of the driving transistor DT, the source electrode of the first transistor T1, the second electrode of the first capacitor C1, and the first electrode of the second capacitor C2 through the second node N2.

The fourth transistor ST4 may be turned on by an emission signal EM of the emission control line EML to connect the driving voltage line VDDL to the third node N3 which is the source electrode of the driving transistor DT. The gate electrode of the fourth transistor ST4 may be connected to the emission control line EML, the source electrode of the fourth transistor ST4 may be connected to the driving voltage line VDDL, and the drain electrode of the fourth transistor ST4 may be connected to the third node N3. The drain electrode of the fourth transistor ST4 may be electrically connected to the source electrode of the driving transistor DT and the drain electrode of the second transistor ST2 through the third node N3.

The fifth transistor ST5 may be turned on by the emission signal EM of the emission control line EML to connect the first node N1 which is the drain electrode of the driving transistor DT to the fourth node N4 which is the anode electrode of the light emitting element EL. The gate electrode of the fifth transistor ST5 may be connected to the emission control line EML, the source electrode of the fifth transistor ST5 may be connected to the first node N1, and the drain electrode of the fifth transistor ST5 may be connected to the fourth node N4. The source electrode of the fifth transistor ST5 may be connected to the drain electrode of the driving transistor DT and the drain electrode of the first transistor ST1 through the first node N1. The drain electrode of the fifth transistor ST5 may be connected to the anode electrode of the light emitting element EL and the drain electrode of the sixth transistor ST6 through the fourth node N4.

When all of the fourth transistor ST4, the driving transistor DT and the fifth transistor ST5 are turned on, the driving current may be supplied to the light emitting element EL.

The sixth transistor ST6 may be turned on by the second scan signal SCb of the second scan line SLb to connect the initialization voltage line VIL to the fourth node N4 which is the anode electrode of and the light emitting element EL. The sixth transistor ST6 may be turned on based on the second scan signal SCb, thereby discharging the anode electrode of the light emitting element EL to the initialization voltage. The gate electrode of the sixth transistor ST6 may be connected to the second scan line SLb, the source electrode of the sixth transistor ST6 may be connected to the initialization voltage line VIL, and the drain electrode of the sixth transistor ST6 may be connected to the fourth node N4. The drain electrode of the sixth transistor ST6 may be connected to the anode electrode of the light emitting element EL and the drain electrode of the fifth transistor ST5 through the fourth node N4.

Each of the driving transistor DT, the second transistor ST2, the fourth transistor ST4, the fifth transistor ST5, and the sixth transistor ST6 may include a silicon-based active layer. For example, each of the driving transistor DT, the second transistor ST2, the fourth transistor ST4, the fifth transistor ST5, and the sixth transistor ST6 may include an active layer made of low temperature polycrystalline silicon (LTPS). The active layer made of low-temperature polycrystalline silicon may have high electron mobility and excellent turn-on characteristics. Accordingly, since the display device 10 includes the driving transistor DT, the second transistor ST2, the fourth transistor ST4, the fifth transistor ST5, and the sixth transistor ST6 having excellent turn-on characteristics, a plurality of sub-pixels can be driven stably and efficiently.

Each of the driving transistor DT, the second transistor ST2, the fourth transistor ST4, the fifth transistor ST5, and the sixth transistor ST6 may correspond to a p-type transistor. For example, each of the driving transistor DT, the second transistor ST2, the fourth transistor ST4, the fifth transistor ST5, and the sixth transistor ST6 may output a current flowing into the source electrode to the drain electrode based on a gate low voltage applied to the gate electrode.

Each of the first transistor ST1 and the third transistor ST3 may include an oxide-based active layer. For example, each of the first transistor ST1 and the third transistor ST3 may have a coplanar structure in which the gate electrode is disposed on the oxide-based active layer. The transistor having a coplanar structure may have excellent off current characteristics and perform low frequency driving, thereby reducing power consumption. Accordingly, the display device 10 may include the first transistor ST1 and the third transistor ST3 having excellent off current characteristics, thereby preventing a leakage current from flowing in the sub-pixel, and stably maintaining the voltage in the sub-pixel.

Each of the first transistor ST1 and the third transistor ST3 may correspond to an n-type transistor. For example, each of the first transistor ST1 and the third transistor ST3 may output a current flowing into the drain electrode to the source electrode based on a gate high voltage applied to the gate electrode.

The first capacitor C1 may be connected between the second scan line SLb and the second node N2. For example, the first electrode of the first capacitor C1 may be connected to the second scan line SLb, and the second electrode of the first capacitor C1 may be connected to the second node N2 which is the gate electrode of the driving transistor DT. The first capacitor C1 may store the difference voltage between the second scan line SLb and the gate electrode of the driving transistor DT to control the voltage of the gate electrode of the driving transistor DT.

The first capacitor C1 may couple the gate electrode of the driving transistor DT using the gate low voltage of the second scan signal SCb. For example, the first capacitor C1 may increase the voltage of the second node N2 when the second scan signal SCb provided from the second scan line SLb rises, and may drop the voltage of the second node N2 when the second scan signal SCb falls. Accordingly, the first capacitor C1 may control the voltage of the gate electrode of the driving transistor DT in synchronization with the rising or falling timing of the second scan signal SCb.

The second capacitor C2 may be connected between the second node N2 which is the gate electrode of the driving transistor DT and the driving voltage line VDDL. For example, the first electrode of the second capacitor C2 may be connected to the second node N2, and the second electrode of the second capacitor C2 may be connected to the driving voltage line VDDL, thereby maintaining the potential difference between the driving voltage line VDDL and the gate electrode of the driving transistor DT.

Referring to FIG. 6 in conjunction with FIG. 5, the display device 10 may be driven through first to fourth periods t1, t2, t3, and t4 of one frame.

The third transistor ST3 may receive the third scan signal SCc at a high level during the first period t1. The third transistor ST3 may be turned on based on the third scan signal SCc of the high level, and may supply an initialization voltage (hereinafter referred to as "VI") to the second node N2 which is the gate electrode of the driving transistor DT. Therefore, the third transistor ST3 may initialize the gate electrode of the driving transistor DT during the first period t1.

The sixth transistor ST6 may receive the second scan signal SCb at a low level during the second period t2. The sixth transistor ST6 may be turned on based on the second scan signal SCb of the low level, and may supply the initialization voltage VI to the fourth node N4 that is the anode electrode of the light emitting element EL. Accordingly, the sixth transistor ST6 may initialize the anode electrode of the light emitting element EL during the second period t2.

The second transistor ST2 may receive the second scan signal SCb at a low level during the second period t2. The second transistor ST2 may be turned on based on the second scan signal SCb of the low level, and may supply a data voltage (hereinafter referred to as "Vdata") to the third node N3 which is the source electrode of the driving transistor DT.

The first transistor ST1 may receive the first scan signal SCa at a high level during the third period t3. The first transistor ST1 may be turned on based on the first scan signal SCa of the high level, and may connect the first node N1 to the second node N2.

When the source electrode of the driving transistor DT receives the data voltage Vdata, a source-gate voltage Vsg of the driving transistor DT may correspond to a difference voltage Vdata-VI between the data voltage Vdata and the initialization voltage VI. The driving transistor DT may be turned on because the source-gate voltage Vsg is greater than the threshold voltage (hereinafter referred to as "Vth") (Vdata-VI≥Vth). Accordingly, at the moment when the driving transistor DT is turned on in the second period t2, the source-drain current Isd of the driving transistor DT may be determined according to the data voltage Vdata, the initialization voltage VI, and the threshold voltage Vth of the driving transistor DT (Isd=k*(Vdata-VI-Vth)^2). The driving transistor DT may supply the source-drain current Isd to the first node N1 until the source-gate voltage Vsg reaches the threshold voltage Vth of the driving transistor DT. Further, the first transistor ST1 may be turned on for the third period t3 to supply the voltage of the first node N1 to the second node N2. In this manner, while the driving transistor DT is turned on, the voltage of the second node N2 and the source-drain current Isd of the driving transistor DT may be changed, and the voltage of the second node N2 may converge to a difference voltage Vdata-Vth between the data voltage Vdata and the threshold voltage Vth of the driving transistor DT.

The emission signal EM may have a gate low voltage during the fourth period t4. When the emission signal EM has a low level, the fourth and fifth transistors ST4 and ST5 may be turned on to supply a driving current to the light emitting element EL.

Figure 7:
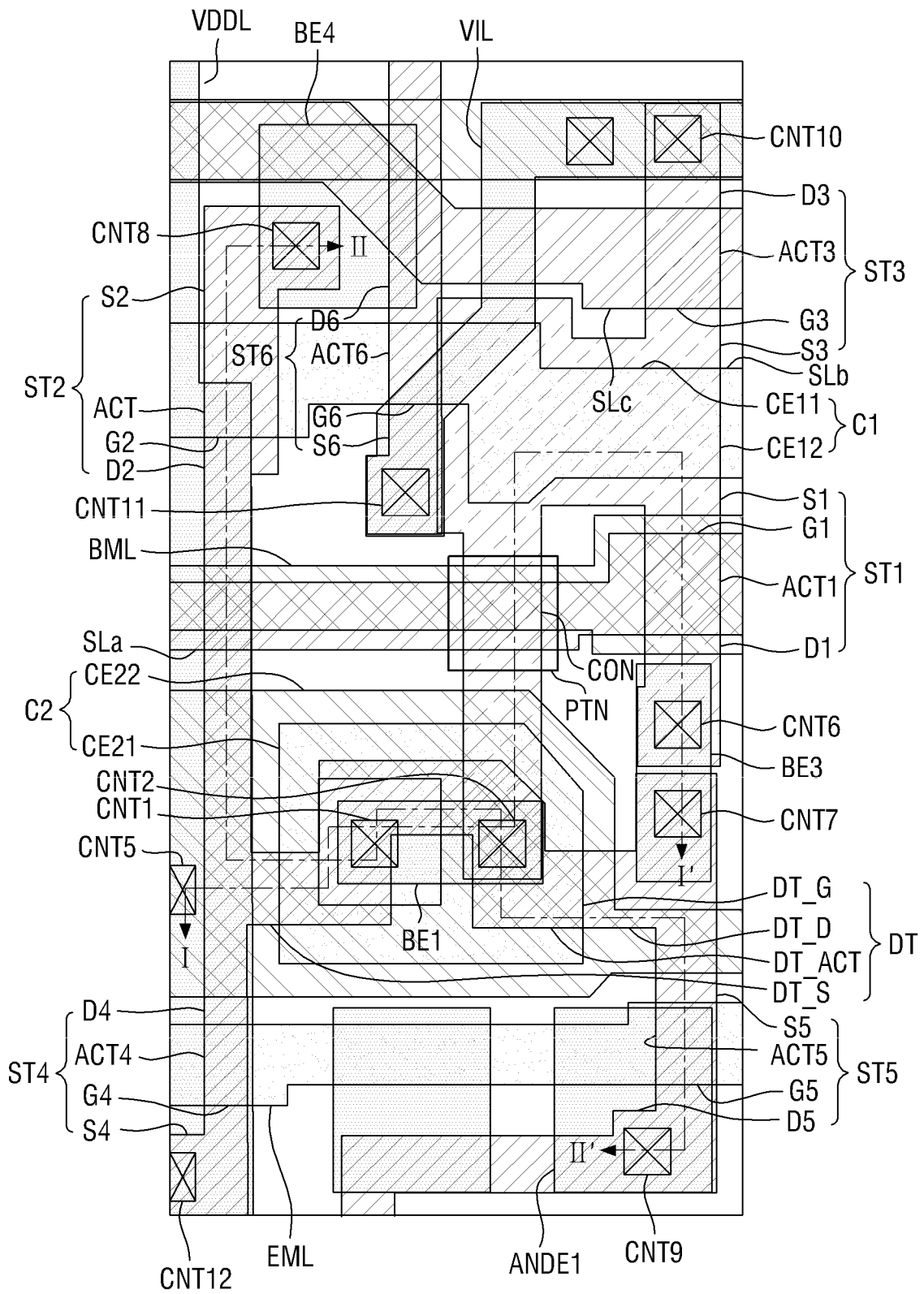
FIG. 7 is a plan view illustrating an example of the sub-pixel shown in FIG. 5.
Figure 8:
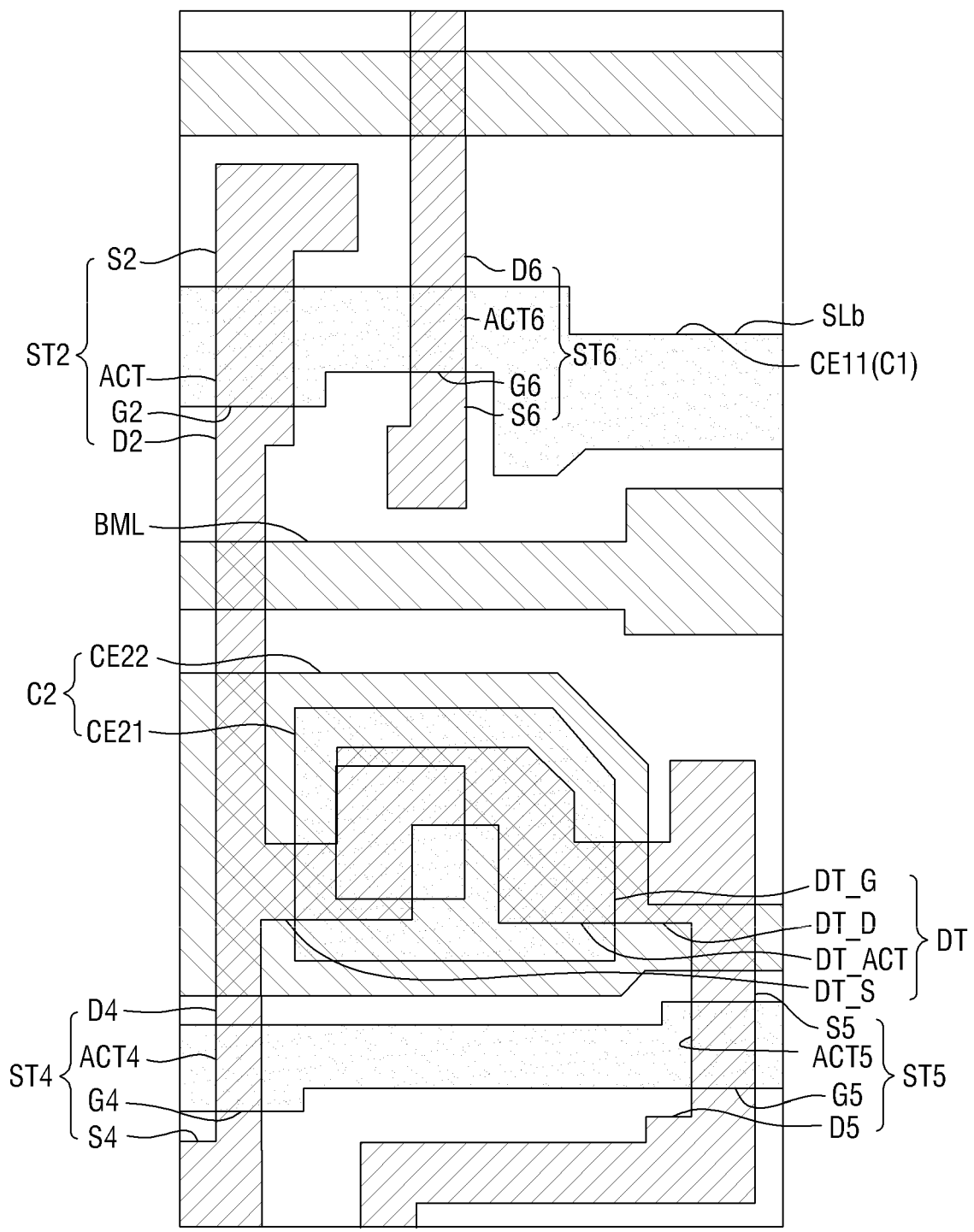
FIG. 8 is a plan view showing some layers of the sub-pixel shown in FIG. 7.
Figure 9:
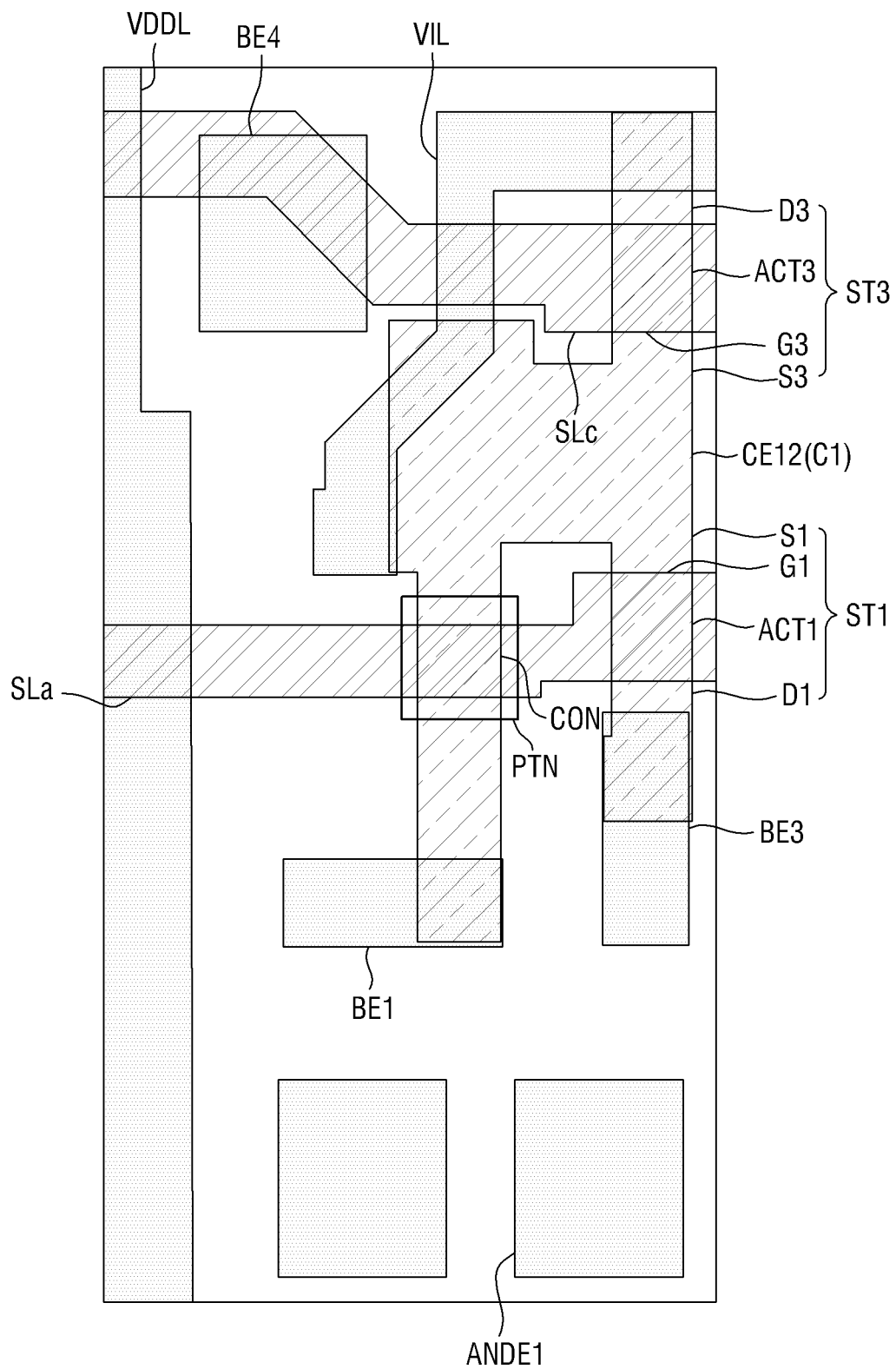
FIG. 9 is a plan view showing some other layers of the sub-pixel shown in FIG. 7.

FIG. 7 is a plan view illustrating an example of the sub-pixel shown in FIG. 5. FIG. 8 is a plan view showing some layers of the sub-pixel shown in FIG. 7. FIG. 9 is a plan view showing some other layers of the sub-pixel shown in FIG. 7. For example, FIG. 7 is a diagram showing a structure in which a first active layer, a first gate layer, a second gate layer, a second active layer, a third gate layer, and a source-drain layer are sequentially stacked. FIG. 8 is a diagram showing a structure in which the first active layer, the first gate layer, and the second gate layer are sequentially stacked, and FIG. 9 is a diagram showing a structure in which the second active layer, the third gate layer, and the source-drain layer are sequentially stacked. The stacking relationship of the layers of FIGS. 7, 8, and 9 will be described in detail with reference to FIGS. 10 and 11 below.

Referring to FIGS. 7, 8, and 9, the driving transistor DT may include an active area DT_ACT, a gate electrode DT_G, a source electrode DT_S, and a drain electrode DT_D. The active area DT_ACT of the driving transistor DT may be disposed in the first active layer, and may overlap the gate electrode DT_G of the driving transistor DT. For example, the first active layer may be made of low temperature polycrystalline silicon (LTPS).

The gate electrode DT_G of the driving transistor DT may be connected to a first connection electrode BE1 through a first contact hole CNT1, and the first connection electrode BE1 may be connected to a conductor portion CON of the second active layer through a second contact hole CNT2. For example, the second active layer may be made of an oxide-based material. Further, a region of the gate electrode DT_G of the driving transistor DT which overlaps a second electrode CE22 of the second capacitor C2 may correspond to a first electrode CE21 of the second capacitor C2.

The source electrode DT_S of the driving transistor DT may be connected to a drain electrode D2 of the second transistor ST2 and a drain electrode D4 of the fourth transistor ST4.

The drain electrode DT_D of the driving transistor DT may be connected to a third connection electrode BE3 through a seventh contact hole CNT7, and the third connection electrode BE3 may be connected to a drain electrode D1 of the first transistor ST1 through a sixth contact hole CNT6. Further, the drain electrode DT_D of the driving transistor DT may be connected to a source electrode S5 of the fifth transistor ST5.

The conductor portion CON of the second active layer may be disposed on an inorganic pattern PTN, and may be disposed below the first scan line SLa. For example, the conductor portion CON of the second active layer, the second electrode CE12 of the first capacitor C1, the drain electrode D1 and the source electrode S1 of the first transistor ST1, and the drain electrode D3 and the source electrode S3 of the third transistor ST3 may be made conductive by heat-treating the oxide-based second active layer.

The second electrode CE12 of the first capacitor C1, the drain electrode D1 and the source electrode S1 of the first transistor ST1, and the drain electrode D3 and the source electrode S3 of the third transistor ST3 may be made conductive by receiving hydrogen from an inorganic layer disposed on the second active layer. Here, the inorganic layer disposed on the second active layer may cover a gate insulating layer and a gate layer on the second active layer. For example, the inorganic layer disposed on the second active layer may include a silicon oxide layer (SiOx) or a silicon nitride layer (SiNx) having a relatively high hydrogen content. Hydrogen contained in the silicon oxide layer (SiOx) or the silicon nitride layer (SiNx) may be diffused into the second active layer through a heat treatment process, and the drain electrode D1 and the source electrode S1 of the first transistor ST1, and the drain electrode D3 and the source electrode S3 of the third transistor ST3 may be made conductive.

For example, the conductor portion CON of the second active layer may overlap the first scan line SLa disposed in the second active layer. That is, since the inorganic layer disposed on the second active layer may cover the first scan line SLa, the first scan line SLa may block diffusion of hydrogen from the inorganic layer into the conductor portion CON of the second active layer in the heat treatment process.

The conductor portion CON of the second active layer may receive hydrogen from the inorganic pattern PTN disposed below the conductor portion CON in the heat treatment process. For example, the inorganic pattern PTN may include a silicon oxide layer (SiOx) or a silicon nitride layer (SiNx) having a relatively high hydrogen content. The hydrogen content of the inorganic pattern PTN may be higher than the hydrogen content of the gate insulating layer covering the second active layer or an interlayer insulating layer disposed below the second active layer. Therefore, even if the conductor portion CON of the second active layer is disposed below the first scan line SLa, it may be used as a wiring connecting the second electrode CE12 of the first capacitor C1 or the source electrode S1 of the first transistor ST1 to the gate electrode DT_G of the driving transistor DT. The display device 10 can implement various contact structures and bridge structures by using an active layer (e.g., the conductor portion CON) disposed below the gate electrode (e.g., the first scan line SLa) as a wiring, thereby increasing the degree of freedom in design of a pixel circuit. As the degree of freedom in design increases, the display device 10 can increase space utilization and improve the resolution of the display device.

The first transistor ST1 may include an active area ACT1, a gate electrode G1, a source electrode S1, and a drain electrode D1. The active area ACT1 of the first transistor ST1 may overlap the gate electrode G1 of the first transistor ST1. The active area ACT1 of the first transistor ST1 may be made of an oxide-based material. The gate electrode G1 of the first transistor ST1 which is a portion of the first scan line SLa may correspond to a region of the first scan line SLa overlapping the active area ACT1.

The drain electrode D1 of the first transistor ST1 may be connected to the third connection electrode BE3 through the sixth contact hole CNT6, and the third connection electrode BE3 may be connected to the drain electrode DT_D of the driving transistor DT and the source electrode S5 of the fifth transistor ST5 through the seventh contact hole CNT7.

The source electrode S1 of the first transistor ST1 may be connected to the source electrode S3 of the third transistor ST3 and the second electrode CE12 of the first capacitor C1. Further, the source electrode S1 of the first transistor ST1 may be connected to the first connection electrode BE1 through the conductor portion CON and the second contact hole CNT2, and the first connection electrode BE1 may be connected to the gate electrode DT_G of the driving transistor DT or the first electrode CE21 of the second capacitor C2 through the first contact hole CNT1.

The second transistor ST2 may include an active area ACT2, a gate electrode G2, a source electrode S2, and a drain electrode D2. The active area ACT2 of the second transistor ST2 may overlap the gate electrode G2 of the second transistor ST2. The active area ACT2 of the second transistor ST2 may be made of low temperature polycrystalline silicon (LTPS). The gate electrode G2 of the second transistor ST2 which is a portion of the second scan line SLb may correspond to a region of the second scan line SLb overlapping the active area ACT2.

The source electrode S2 of the second transistor ST2 may be connected to a fourth connection electrode BE4 through an eighth contact hole CNT8, and the fourth connection electrode BE4 may be connected to the data line DL. Accordingly, the source electrode S2 of the second transistor ST2 may receive the data voltage from the data line DL.

The drain electrode D2 of the second transistor ST2 may be connected to the source electrode DT_S of the driving transistor DT and the drain electrode D4 of the fourth transistor ST4.

The third transistor ST3 may include an active area ACT3, a gate electrode G3, a drain electrode D3, and a source electrode S3. The active area ACT3 of the third transistor ST3 may overlap the gate electrode G3 of the third transistor ST3. The active area ACT3 of the third transistor ST3 may include an oxide-based active layer. The gate electrode G3 of the third transistor ST3 which is a portion of the third scan line SLc may correspond to a region of the third scan line SLc overlapping the active area ACT3.

The drain electrode D3 of the third transistor ST3 may be connected to the initialization voltage line VIL through a tenth contact hole CNT10 to receive the initialization voltage VI.

The source electrode S3 of the third transistor ST3 may be connected to the source electrode S1 of the first transistor ST1 and the second electrode CE12 of the first capacitor C1. Further, the source electrode S3 of the third transistor ST3 may be connected to the first connection electrode BE1 through the conductor portion CON and the second contact hole CNT2, and the first connection electrode BE1 may be connected to the gate electrode DT_G of the driving transistor DT or the first electrode CE21 of the second capacitor C2 through the first contact hole CNT1.

The fourth transistor ST4 may include an active area ACT4, a gate electrode G4, a source electrode S4, and a drain electrode D4. The active area ACT4 of the fourth transistor ST4 may overlap the gate electrode G4 of the fourth transistor ST4. The active area ACT4 of the fourth transistor ST4 may be formed of low temperature polycrystalline silicon (LTPS). The gate electrode G4 of the fourth transistor ST4 which is a portion of the emission control line EML may correspond to a region of the emission control line EML overlapping the active area ACT4.

The source electrode S4 of the fourth transistor ST4 may be connected to the driving voltage line VDDL through a twelfth contact hole CNT12. Accordingly, the source electrode S4 of the fourth transistor ST4 may receive the driving voltage VDD from the driving voltage line VDDL.

The drain electrode D4 of the fourth transistor ST4 may be connected to the source electrode DT_S of the driving transistor DT and the drain electrode D2 of the second transistor ST2.

The fifth transistor ST5 may include an active area ACT5, a gate electrode G5, a source electrode S5, and a drain electrode D5. The active area ACT5 of the fifth transistor ST5 may overlap the gate electrode G5 of the fifth transistor ST5. The active area ACT5 of the fifth transistor ST5 may be formed of low temperature polycrystalline silicon (LTPS). The gate electrode G5 of the fifth transistor ST5 which is a portion of the emission control line EML may correspond to a region of the emission control line EML overlapping the active area ACT5.

The source electrode S5 of the fifth transistor ST5 may be connected to the drain electrode DT_D of the driving transistor DT. Further, the source electrode S5 of the fifth transistor ST5 may be connected to the third connection electrode BE3 through the seventh contact hole CNT7, and the third connection electrode BE3 may be connected to the drain electrode D1 of the first transistor ST1 through the sixth contact hole CNT6.

The drain electrode D5 of the fifth transistor ST5 may be connected to a first anode connection electrode ANDE1 through a ninth contact hole CNT9. The first anode connection electrode ANDE1 may be connected to the anode electrode of the light emitting element EL.

The sixth transistor ST6 may include an active area ACT6, a gate electrode G6, a drain electrode D6, and a source electrode S6. The active area ACT6 of the sixth transistor ST6 may overlap the gate electrode G6 of the sixth transistor ST6. The active area ACT6 of the sixth transistor ST6 may be formed of low temperature polycrystalline silicon (LTPS). The gate electrode G6 of the sixth transistor ST6 which is a portion of the second scan line SLb may correspond to a region of the second scan line SLb overlapping the active area ACT6.

The source electrode S6 of the sixth transistor ST6 may be connected to the initialization voltage line VIL through an eleventh contact hole CNT11 to receive the initialization voltage VI.

The drain electrode D6 of the sixth transistor ST6 may be connected to the first anode connection electrode ANDE1 through the ninth contact hole CNT9. The first anode connection electrode ANDE1 may be connected to the anode electrode of the light emitting element EL.

The first capacitor C1 may include a first electrode CE11 and a second electrode CE12. The first electrode CE11 of the first capacitor C1 which is a portion of the second scan line SLb may correspond to a region of the second scan line SLb overlapping the second active layer. The second electrode CE12 of the first capacitor C1 which is a portion of the second active layer may correspond to a region of the second active layer overlapping the second scan line SLb.

The second electrode CE12 of the first capacitor C1 may be connected to the first connection electrode BE1 through the conductor portion CON and the second contact hole CNT2, and the first connection electrode BE1 may be connected to the gate electrode DT_G of the driving transistor DT or the first electrode CE21 of the second capacitor C2 through the first contact hole CNT1. The first capacitor C1 may couple the gate electrode of the driving transistor DT using the gate low voltage of the second scan signal SCb. Therefore, the first capacitor C1 may drop the voltage of the gate electrode DT_G of the driving transistor DT in synchronization with the falling time of the second scan signal SCb, thereby increasing the turn-on characteristics of the driving transistor DT and improving the luminance of the light emitting element EL.

The second capacitor C2 may include a first electrode CE21 and a second electrode CE22. The first electrode CE21 of the second capacitor C2 which is a portion of the gate electrode DT_G of the driving transistor DT may correspond to a region of the gate electrode DT_G of the driving transistor DT overlapping the second gate layer. The first electrode CE21 of the second capacitor C2 may be connected to the first connection electrode BE1 through the first contact hole CNT1, and the first connection electrode BE1 may be connected to the conductor portion CON of the second active layer through the second contact hole CNT2.

The second electrode CE22 of the second capacitor C2 may be connected to the driving voltage line VDDL through the fifth contact hole CNT5. Accordingly, the second electrode CE22 of the second capacitor C2 may receive the driving voltage VDD from the driving voltage line VDDL.

Figure 10:
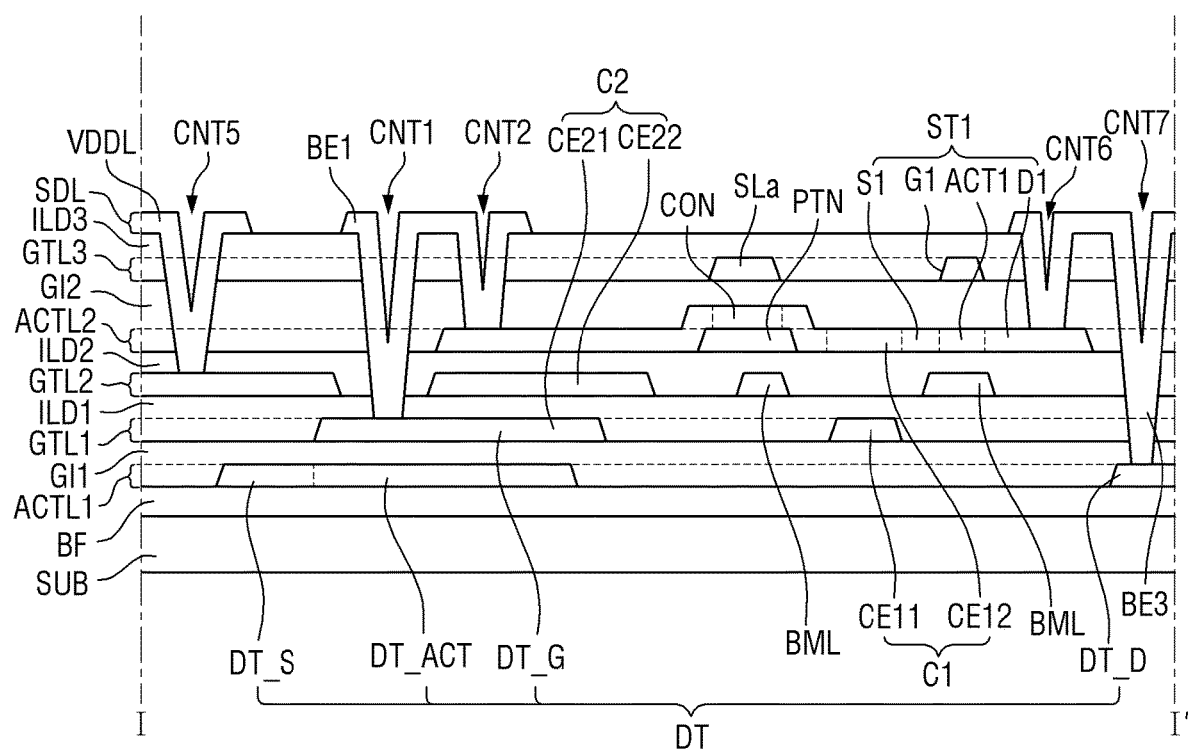
FIG. 10 is a cross-sectional view taken along line I-I' of FIG. 7.
Figure 11:
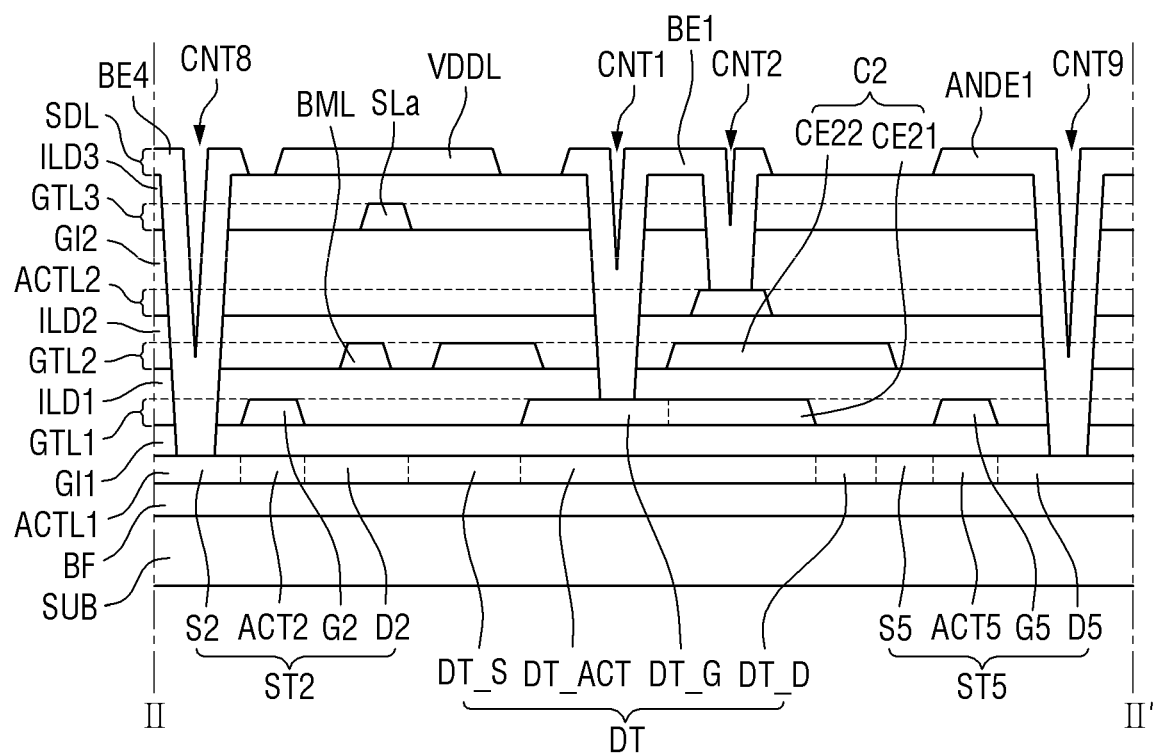
FIG. 11 is a cross-sectional view taken along line II-IT of FIG. 7.

FIG. 10 is a cross-sectional view taken along line I-I' of FIG. 7, and FIG. 11 is a cross-sectional view taken along line II-IT of FIG. 7.

Referring to FIGS. 10 and 11 in conjunction with FIGS. 7, 8, and 9, the display panel 300 may include a substrate SUB, a buffer layer BF, a first active layer ACTL1, a first gate insulating layer GI1, a first gate layer GTL1, a first interlayer insulating layer ILD1, a second gate layer GTL2, a second interlayer insulating layer ILD2, an inorganic pattern PTN, a second active layer ACTL2, a second gate insulating layer GI2, a third gate layer GTL3, a third interlayer insulating layer ILD3, and a source-drain layer SDL.

The substrate SUB may be a base substrate, and may be made of an insulating material such as polymer resin. For example, the substrate SUB may be a flexible substrate which can be bent, folded, or rolled.

For example, the display panel 300 may further include a light blocking layer overlapping at least one of the first to sixth transistors ST1, ST2, ST3, ST4, ST5, and ST6 and the driving transistor DT. The light blocking layer may block light incident on the driving transistor DT or the first to sixth transistors ST1, ST2, ST3, ST4, ST5, and ST6, thereby improving the turn-on characteristics of the transistor.

The buffer layer BF may be disposed on the substrate SUB. For example, the buffer layer BF may include a plurality of inorganic layers, and may be formed on the entire upper surface of the substrate SUB to prevent moisture from penetrating the light emitting element EL through the substrate SUB.

The first active layer ACTL1 may be disposed on the buffer layer BF. The first active layer ACTL1 may be made of a silicon-based material. For example, the first active layer ACTL1 may be formed of low temperature polycrystalline silicon (LTPS). The active areas DT_ACT, ACT2, ACT4, ACT5 and ACT6, the source electrodes DT_S, S2, S4, S5 and S6, and the drain electrodes DT_D, D2, D4, D5 and D6 of the driving transistor DT, the second transistor ST2, the fourth transistor ST4, the fifth transistor ST5 and the sixth transistor ST6 may be disposed in the first active layer ACTL1.

The first gate insulating layer GI1 may cover the buffer layer BF and the first active layer ACTL1, and insulate the first active layer ACTL1 from the first gate layer GTL1.

The first gate layer GTL1 may be disposed on the first gate insulating layer GI1. The gate electrode DT_G of the driving transistor DT, the second scan line SLb, and the emission control line EML may be disposed in the first gate layer GTL1.

A portion of the gate electrode DT_G of the driving transistor DT may overlap the second electrode CE22 of the second capacitor C2 disposed in the second gate layer GTL2 to form the first electrode CE21 of the second capacitor C2.

A portion of the second scan line SLb may overlap the active area ACT2 of the second transistor ST2 to form the gate electrode G2 of the second transistor ST2. Another portion of the second scan line SLb may overlap the active area ACT6 of the sixth transistor ST6 to form the gate electrode G6 of the sixth transistor ST6. Still another portion of the second scan line SLb may overlap the second electrode CE12 of the first capacitor C1 disposed in the second active layer ACTL2 to form the first electrode CE11 of the first capacitor C1.

A portion of the emission control line EML may overlap the active area ACT4 of the fourth transistor ST4 to form the gate electrode G4 of the fourth transistor ST4. Another portion of the emission control line EML may overlap the active area ACT5 of the fifth transistor ST5 to form the gate electrode G5 of the fifth transistor ST5.

The first interlayer insulating layer ILD1 may cover the first gate layer GTL1 and the first gate insulating layer GIL The first interlayer insulating layer ILD1 may insulate the first gate layer GTL1 from the second gate layer GTL2.

The second gate layer GTL2 may be disposed on the first interlayer insulating layer ILD1. The second electrode CE22 of the second capacitor C2 and the light blocking layer BML may be disposed in the second gate layer GTL2. The light blocking layer BML may be disposed to overlap the first transistor ST1 to block light incident on the first transistor ST1. The second electrode CE22 of the second capacitor C2 may overlap the first electrode CE21 disposed in the first gate layer GTL1.

The second interlayer insulating layer ILD2 may cover the second gate layer GTL2 and the first interlayer insulating layer ILD1. The second interlayer insulating layer ILD2 may insulate the second gate layer GTL2 from the second active layer ACTL2.

The inorganic pattern PTN may be interposed between the second interlayer insulating layer ILD2 and the second active layer ACTL2. For example, the inorganic pattern PTN may overlap an intersection area of the second active layer ACTL2 and the first scan line SLa. The conductor portion CON of the second active layer ACTL2 may be disposed on the inorganic pattern PTN, and may be disposed below the first scan line SLa. For example, the conductor portion CON, the second electrode CE12 of the first capacitor C1, the drain electrode D1 and the source electrode S1 of the first transistor ST1, and the drain electrode D3 and the source electrode S3 of the third transistor ST3 may be made conductive by heat-treating the oxide-based second active layer ACTL2.

The second electrode CE12 of the first capacitor C1, the drain electrode D1 and the source electrode S1 of the first transistor ST1, and the drain electrode D3 and the source electrode S3 of the third transistor ST3 may be made conductive by receiving hydrogen from the third interlayer insulating layer ILD3. Here, the third interlayer insulating layer ILD3 may cover the second gate insulating layer GI2 and the third gate layer GTL3 on the second active layer ACTL2. The third interlayer insulating layer ILD3 may include a silicon oxide layer (SiOx) or a silicon nitride layer (SiNx) having a relatively high hydrogen content. Hydrogen contained in the silicon oxide layer (SiOx) or the silicon nitride layer (SiNx) may be diffused into the second active layer ACTL2 through a heat treatment process, and the second electrode CE12 of the first capacitor C1, the drain electrode D1 and the source electrode S1 of the first transistor ST1, and the drain electrode D3 and the source electrode S3 of the third transistor ST3 may be made conductive.

For example, the conductor portion CON of the second active layer ACTL2 may overlap the first scan line SLa disposed on the second active layer ACTL2. That is, since the third interlayer insulating layer ILD3 may cover the first scan line SLa disposed in the third gate layer GTL3, the first scan line SLa may block diffusion of hydrogen from the third interlayer insulating layer ILD3 into the conductor portion CON of the second active layer ACTL2 in the heat treatment process.

The conductor portion CON of the second active layer ACTL2 may receive hydrogen from the inorganic pattern PTN disposed below the conductor portion CON in the heat treatment process. For example, the inorganic pattern PTN may include a silicon oxide layer (SiOx) or a silicon nitride layer (SiNx) having a relatively high hydrogen content. The hydrogen content of the inorganic pattern PTN may be higher than the hydrogen content of the second gate insulating layer GI2 covering the second active layer ACTL2 or the second interlayer insulating layer ILD2 disposed below the second active layer ACTL2. Accordingly, even if the conductor portion CON of the second active layer ACTL2 is disposed below the first scan line SLa, it may be made conductive by receiving hydrogen from the inorganic pattern PTN. The conductor portion CON of the second active layer ACTL2 may be used as a wiring connecting the source electrode S3 of the third transistor ST3, the source electrode S1 of the first transistor ST1 or the second electrode CE12 of the first capacitor C1 connected to one end of the conductor portion CON to the first electrode CE21 of the second capacitor C2 or the gate electrode DT_G of the driving transistor DT connected to the other end of the conductor portion CON. The display device 10 can implement various contact structures and bridge structures by using, as a wiring, the conductor portion CON disposed below the first scan line SLa disposed in the third gate layer GTL3, thereby increasing the degree of freedom in design of a pixel circuit. As the degree of freedom in design increases, the display device 10 can increase space utilization and improve the resolution of the display device.

The second active layer ACTL2 may be disposed on the second interlayer insulating layer ILD2. The second active layer ACTL2 may be made of an oxide-based material. The active areas ACT1 and ACT3, the drain electrodes D1 and D3, and the source electrodes S1 and S3 of the first and third transistors ST1 and ST3 may be disposed in the second active layer ATL2. Further, a portion of the second active layer ACTL2 may overlap the second scan line SLb disposed in the first gate layer GTL1 to form the second electrode CE12 of the first capacitor C1.

The second gate insulating layer GI2 may cover the second interlayer insulating layer ILD2 and the second active layer ACTL2, and insulate the second active layer ACTL2 from the third gate layer GTL3.

The third gate layer GTL3 may be disposed on the second gate insulating layer GI2. The first scan line SLa and the third scan line SLc may be disposed in the third gate layer GTL3. A portion of the first scan line SLa may overlap the active area ACT1 of the first transistor ST1 to form the gate electrode G1 of the first transistor ST1. A portion of the third scan line SLc may overlap the active area ACT3 of the third transistor ST3 to form the gate electrode G3 of the third transistor ST3.

The third interlayer insulating layer ILD3 may cover the third gate layer GTL3 and the second gate insulating layer GI2. The third interlayer insulating layer ILD3 may insulate the third gate layer GTL3 from the source-drain layer SDL.

The source-drain layer SDL may be disposed on the third interlayer insulating layer ILD3. Each of the first, third and fourth connection electrodes BE1, BE3 and BE4, the driving voltage line VDDL, the initialization voltage line VIL, and the first anode connection electrode ANDE1 may be disposed in the source-drain layer SDL.

The first connection electrode BE1 may be connected to the gate electrode DT_G of the driving transistor DT through the first contact hole CNT1, and may be connected to the conductor portion CON of the second active layer through the second contact hole CNT2.

The third connection electrode BE3 may be connected to the source electrode S1 of the first transistor ST1 through the sixth contact hole CNT6, and may be connected to the drain electrode DT_D of the driving transistor DT through the seventh contact hole CNT7.

The fourth connection electrode BE4 may be connected to the source electrode S2 of the second transistor ST2 through the eighth contact hole CNT8. Further, the fourth connection electrode BE4 may be connected to the data line DL.

The driving voltage line VDDL may be connected to the second electrode CE22 of the second capacitor C2 through the fifth contact hole CNT5, and may be connected to the source electrode S4 of the fourth transistor ST4 through the twelfth contact hole CNT12.

The initialization voltage line VIL may be connected to the drain electrode D3 of the third transistor ST3 through the tenth contact hole CNT10, and may be connected to the source electrode S6 of the sixth transistor ST6 through the eleventh contact hole CNT11.

The first anode connection electrode ANDE1 may be connected to the drain electrode D5 of the fifth transistor ST5 through the ninth contact hole CNT9. Further, the first anode connection electrode ANDE1 may be connected to the anode electrode of the light emitting element EL.

Figure 12:
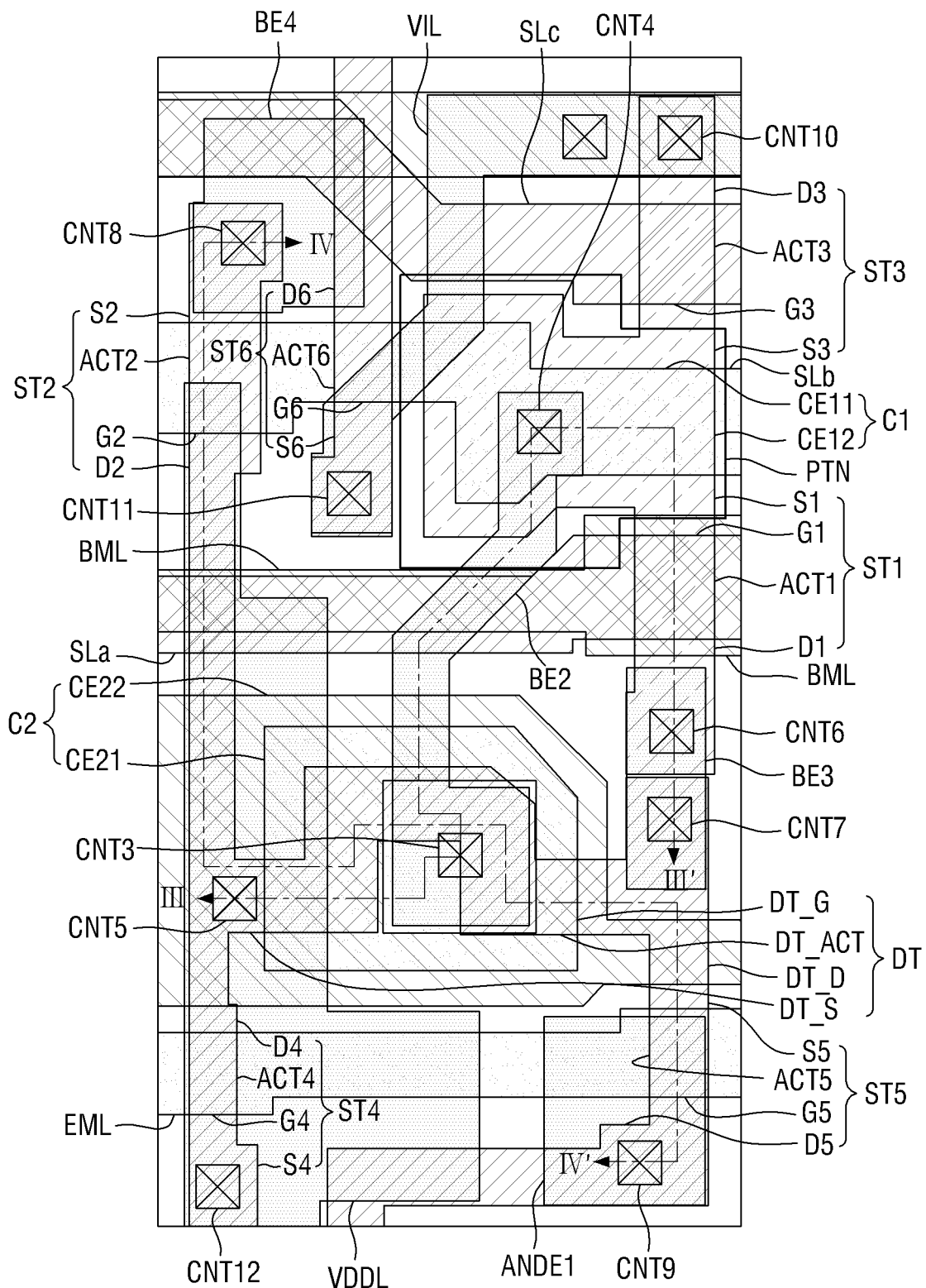
FIG. 12 is a plan view illustrating another example of the sub-pixel shown in FIG. 5.
Figure 13:
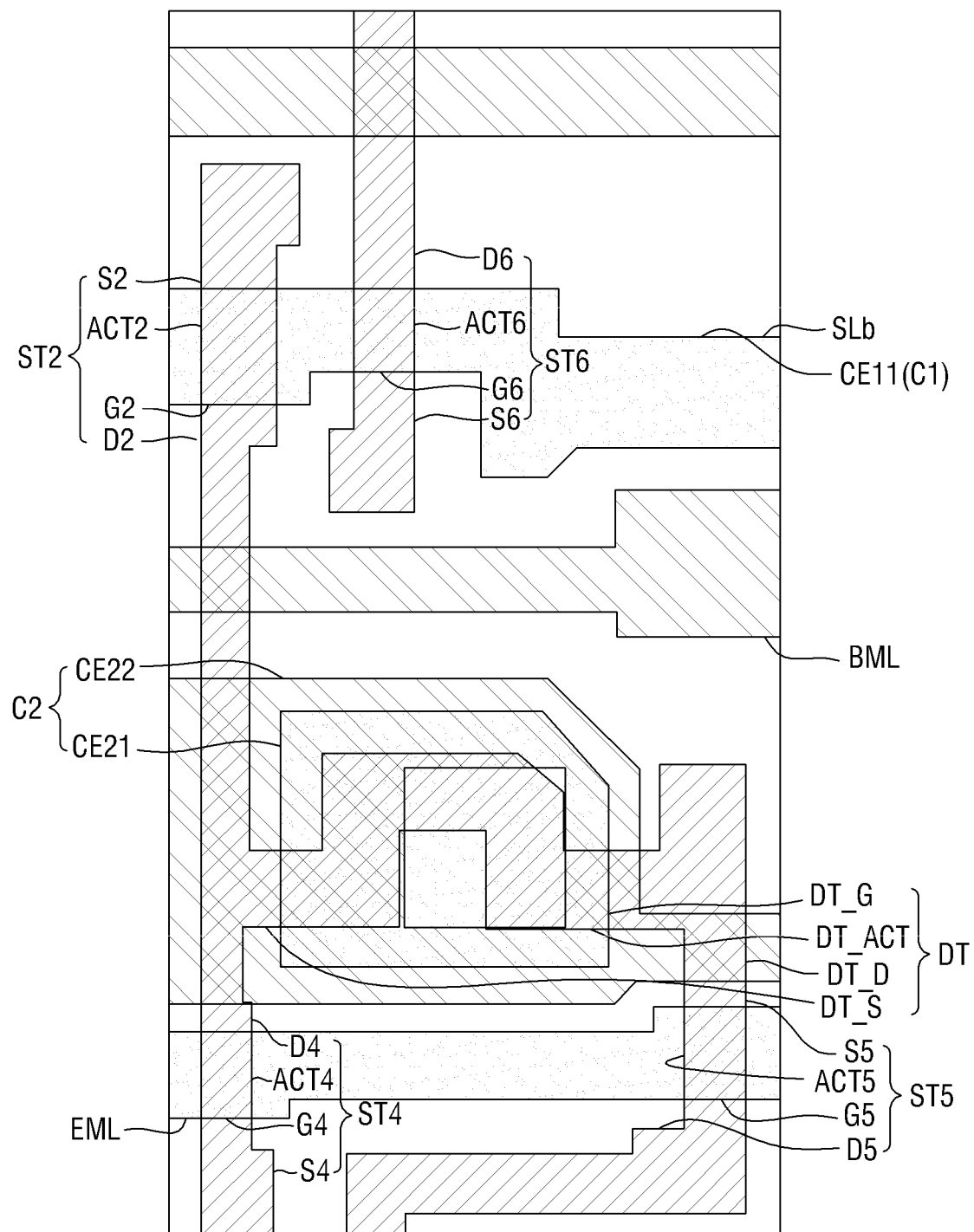
FIG. 13 is a plan view showing some layers of the sub-pixel shown in FIG. 12.
Figure 14:
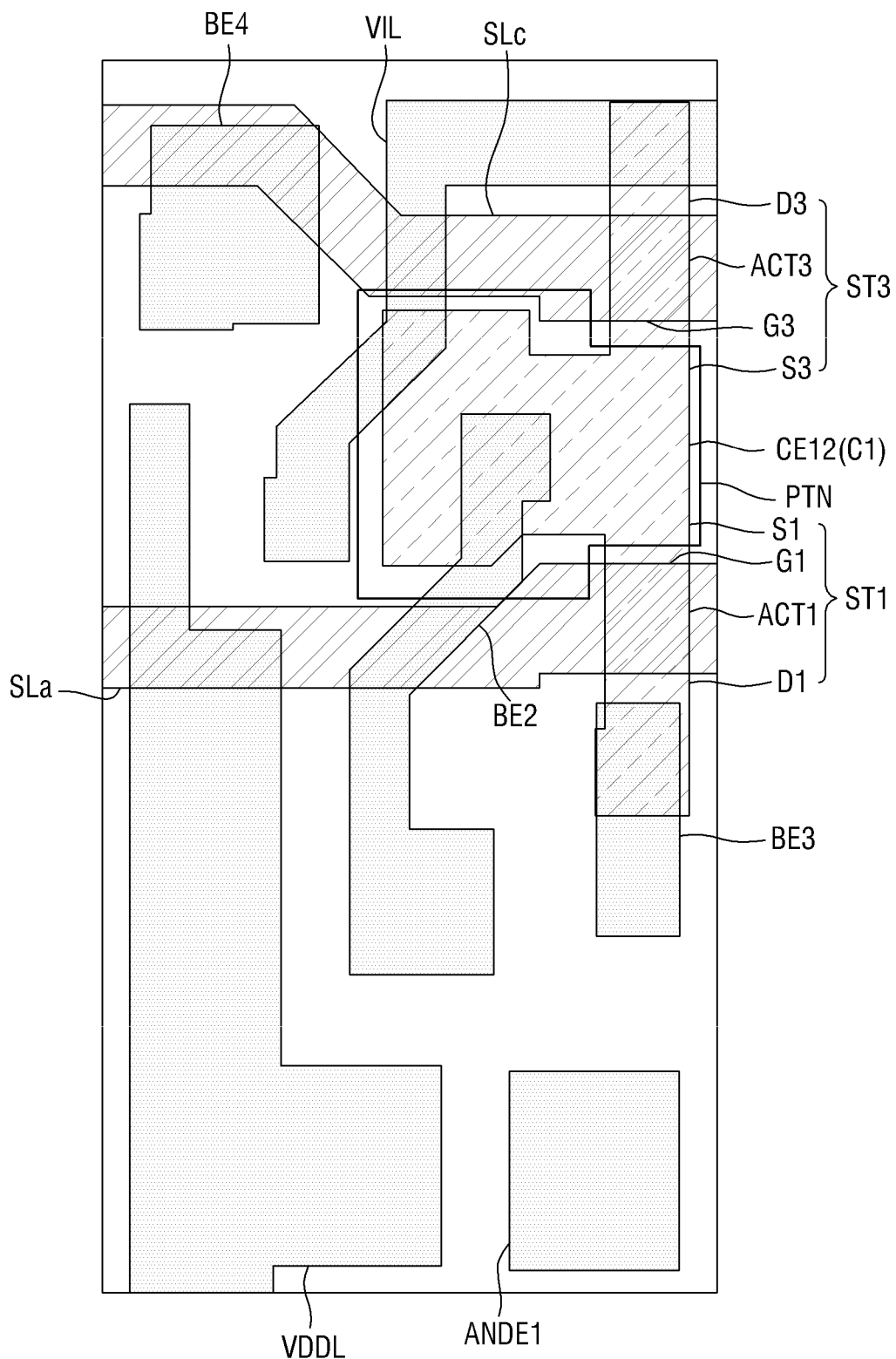
FIG. 14 is a plan view showing some other layers of the sub-pixel shown in FIG. 12.
Figure 15:
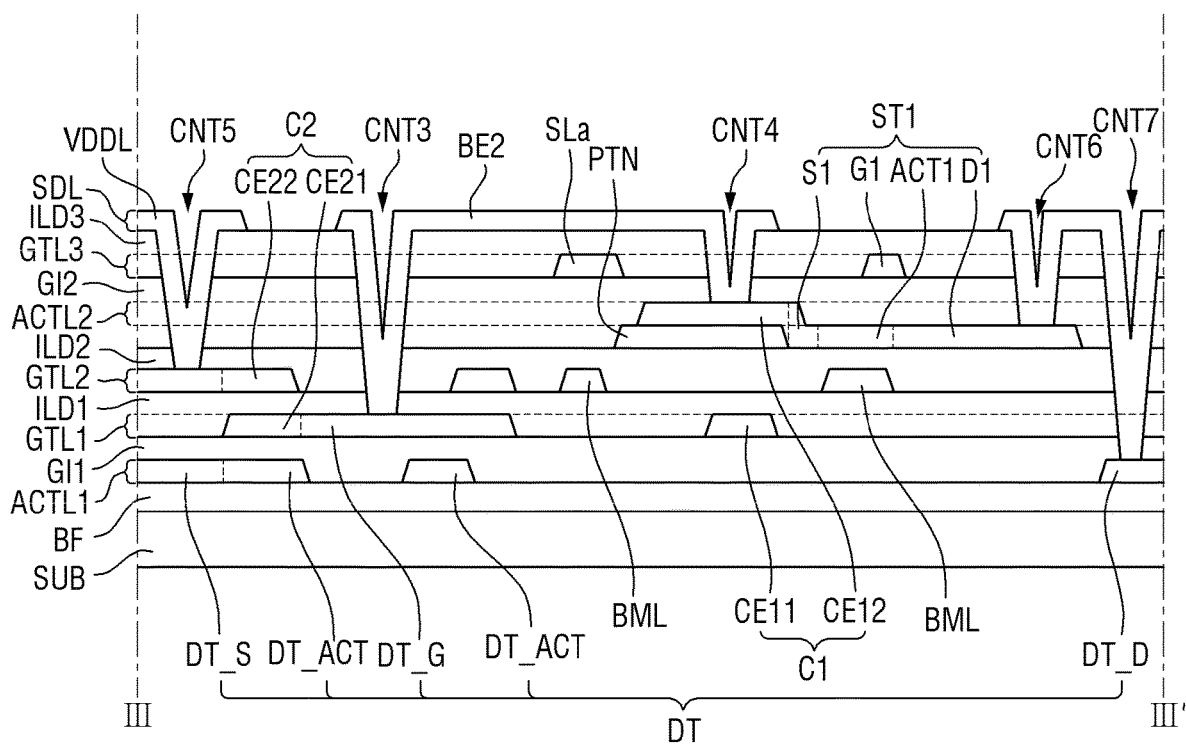
FIG. 15 is a cross-sectional view taken along line III-III' of FIG. 12.
Figure 16:
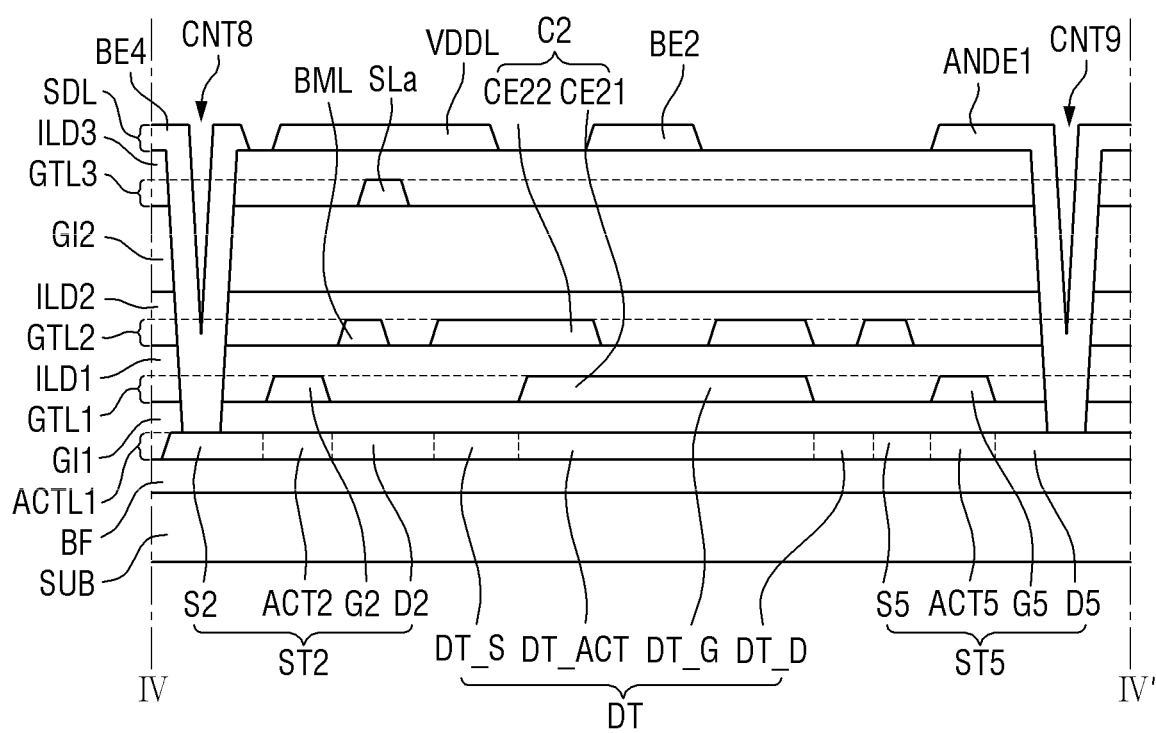
FIG. 16 is a cross-sectional view taken along line IV-IV' of FIG. 12.

FIG. 12 is a plan view illustrating another example of the sub-pixel shown in FIG. 5. FIG. 13 is a plan view showing some layers of the sub-pixel shown in FIG. 12. FIG. 14 is a plan view showing some other layers of the sub-pixel shown in FIG. 12. For example, FIG. 12 is a diagram showing a structure in which a first active layer, a first gate layer, a second gate layer, a second active layer, a third gate layer, and a source-drain layer are sequentially stacked. FIG. 13 is a diagram showing a structure in which the first active layer, the first gate layer, and the second gate layer are sequentially stacked, and FIG. 14 is a diagram showing a structure in which the second active layer, the third gate layer, and the source-drain layer are sequentially stacked. Further, FIG. 15 is a cross-sectional view taken along line III-III' of FIG. 12, and FIG. 16 is a cross-sectional view taken along line IV-IV' of FIG. 12.

The sub-pixels shown in FIGS. 12, 13, 14, 15, and 16 are different from the sub-pixels described above in the arrangement of the inorganic pattern PTN and the connection structure of the pixel circuit. The same configuration as the above-described configuration will be briefly described or omitted.

Referring to FIGS. 12, 13, 14, 15, and 16, the display panel 300 may include a substrate SUB, a buffer layer BF, a first active layer ACTL1, a first gate insulating layer GI1, a first gate layer GTL1, a first interlayer insulating layer ILD1, a second gate layer GTL2, a second interlayer insulating layer ILD2, an inorganic pattern PTN, a second active layer ACTL2, a second gate insulating layer GI2, a third gate layer GTL3, a third interlayer insulating layer ILD3, and a source-drain layer SDL. Each of the plurality of sub-pixels of the display panel 300 may include a driving transistor DT, first to sixth transistors ST1, ST2, ST3, ST4, ST5 and ST6, and first and second capacitors C1 and C2.

The display panel 300 may further include a second connection electrode BE2 disposed in the source-drain layer SDL. The gate electrode DT_G of the driving transistor DT may be connected to the second connection electrode BE2 through a third contact hole CNT3, and the second connection electrode BE2 may be connected to the second electrode CE12 of the first capacitor C1 through the fourth contact hole CNT4. The second electrode CE12 of the first capacitor C1 may be connected to the source electrode S1 of the first transistor ST1 and the source electrode S3 of the third transistor ST3. Further, a region of the gate electrode DT_G of the driving transistor DT which overlaps the second gate layer GTL2 may correspond to the first electrode CE21 of the second capacitor C2.

The second electrode CE12 of the first capacitor C1, the drain electrode D1 and the source electrode S1 of the first transistor ST1, and the drain electrode D3 and the source electrode S3 of the third transistor ST3 may be made conductive by heat-treating the oxide-based second active layer ACTL2.

For example, the second electrode CE12 of the first capacitor C1, the drain electrode D1 and the source electrode S1 of the first transistor ST1, and the drain electrode D3 and the source electrode S3 of the third transistor ST3 may be made conductive by receiving hydrogen from the third interlayer insulating layer ILD3. Here, the third interlayer insulating layer ILD3 may cover the second gate insulating layer GI2 and the third gate layer GTL3 on the second active layer ACTL2. For example, the third interlayer insulating layer ILD3 may include a silicon oxide layer (SiOx) or a silicon nitride layer (SiNx) having a relatively high hydrogen content. Hydrogen contained in the silicon oxide layer (SiOx) or the silicon nitride layer (SiNx) may be diffused into the second active layer ACTL2 through a heat treatment process, and the second electrode CE12 of the first capacitor C1, the drain electrode D1 and the source electrode S1 of the first transistor ST1, and the drain electrode D3 and the source electrode S3 of the third transistor ST3 may be made conductive.

The inorganic pattern PTN may be disposed below the second electrode CE12 of the first capacitor C1. For example, the inorganic pattern PTN may be disposed to overlap the second electrode CE12 of the first capacitor C1 and the inorganic pattern PTN may be disposed between the second interlayer insulating layer ILD2 and the second active layer ACTL2.

The second electrode CE12 of the first capacitor C1 may receive hydrogen from the third interlayer insulating layer ILD3 in the heat treatment process, and may additionally receive hydrogen from the inorganic pattern PTN. For example, the inorganic pattern PTN may include a silicon oxide layer (SiOx) or a silicon nitride layer (SiNx) having a relatively high hydrogen content. The hydrogen content of the inorganic pattern PTN may be higher than the hydrogen content of the second gate insulating layer GI2 covering the second active layer ACTL2 or the second interlayer insulating layer ILD2 disposed below the second active layer ACTL2. Therefore, the conductivity of the second electrode CE12 of the first capacitor C1 may be higher than that of the second active layer ACTL2 not overlapping the inorganic pattern PTN. For example, the conductivity of the second electrode CE12 of the first capacitor C1 may be higher than that of the drain electrode D1 and the source electrode S1 of the first transistor ST1 and the drain electrode D3 and the source electrode S3 of the third transistor ST3. Thus, the display device 10 can eliminate luminance non-uniformity (mura) due to a variation in conductivity of a plurality of pixels, and improve the reliability of the display device 10.

What is claimed is:

1. A display device having a pixel, the display device comprising:
   a substrate;
   a first semiconductor layer on the substrate;
   a first insulating layer on the first semiconductor layer;
   a first conductive layer on the first insulating layer;
   wherein the pixel comprises a first transistor and a capacitor on the substrate,
   the first semiconductor layer comprises a first active pattern of the first transistor and a first electrode of the capacitor, and
   the first conductive layer comprises a first gate of the first transistor and a second electrode of the capacitor; and
   an inorganic pattern covered by the first semiconductor layer and directly contacting the first semiconductor layer.

2. The display device of claim 1, wherein an upper surface and a side surface of the inorganic pattern are in contact with the first active pattern.

3. The display device of claim 1, wherein a hydrogen content of the inorganic pattern is higher than a hydrogen content of the first insulating layer.

4. The display device of claim 1, wherein the first active pattern comprises a conductor portion disposed between the first gate of the first transistor and the inorganic pattern.

5. The display device of claim 1, wherein a conductivity of the conductor portion in the first active layer is higher than a conductivity of a portion other than the conductor portion in the first active layer.

6. The display device of claim 1, wherein the first gate of the first transistor and the second electrode of the capacitor are spaced apart from each other.

7. The display device of claim 1, wherein the first active pattern of the first transistor and the first electrode of the capacitor are physically connected to each other.

8. The display device of claim 1, wherein the first semiconductor layer comprises an oxide semiconductor material.

9. A display device having a pixel, the display device comprising:
   a substrate;
   a first semiconductor layer on the substrate;
   a first insulating layer on the first semiconductor layer;
   a first conductive layer on the first insulating layer;
   wherein the pixel comprises a first transistor and a capacitor on the substrate,
   the first semiconductor layer comprises a first active pattern of the first transistor and a first electrode of the capacitor, and
   the first conductive layer comprises a first gate of the first transistor and a second electrode of the capacitor; and
   wherein a distance between the first active pattern and the first gate of the first transistor is smaller than a distance between the first electrode and the second electrode of the capacitor.

10. The display device of claim 9, wherein the first gate of the first transistor and the second electrode of the capacitor are spaced apart from each other.

11. The display device of claim 9, wherein the first active pattern of the first transistor and the first electrode of the capacitor are physically connected to each other.

12. The display device of claim 9, wherein the first semiconductor layer comprises an oxide semiconductor material.

13. A display device having a pixel, the display device comprising:
    a substrate;
    a first semiconductor layer on the substrate;
    a first insulating layer on the first semiconductor layer;
    a first conductive layer on the first insulating layer;

wherein the pixel comprises a first transistor, a capacitor on the substrate, a second transistor and a light emitting element, wherein the second transistor is a driving transistor configured to control a current flowing in the light emitting element, and wherein the first transistor is a switching transistor configured to transmit a drain voltage of the second transistor to the second gate of the second transistor;

wherein the first semiconductor layer comprises a first active pattern of the first transistor and a first electrode of the capacitor, and the first conductive layer comprises a first gate of the first transistor and a second electrode of the capacitor;

a second semiconductor layer on the substrate wherein the second semiconductor layer comprises a second active layer of the second transistor;

a second insulating layer on the second semiconductor layer;

a second conductive layer on the second insulating layer, wherein the second conductive layer comprises a second gate of the second transistor; and a first interlayer insulating layer between the second conductive layer and the first semiconductor layer.

14. The display device of claim 13, wherein the second semiconductor layer is made of a different material from the first semiconductor layer.

15. The display device of claim 14, wherein the second semiconductor layer comprises a polysilicon material.

16. The display device of claim 13, wherein the first gate of the first transistor and the second electrode of the capacitor are spaced apart from each other.

17. The display device of claim 13, wherein the first active pattern of the first transistor and the first electrode of the capacitor are physically connected to each other.

18. The display device of claim 13, wherein the first semiconductor layer comprises an oxide semiconductor material.

* * * * *